(12) United States Patent
Park et al.

(10) Patent No.: US 11,340,533 B2
(45) Date of Patent: May 24, 2022

(54) SUBSTRATE TREATING APPARATUS AND SUBSTRATE TREATING METHOD

(71) Applicant: SEMES CO., LTD., Cheonan-si (KR)

(72) Inventors: Min Jung Park, Daegu (KR); Jung Yul Lee, Cheongju-si (KR); Choongki Min, Cheonan-si (KR); Kyungjin Seo, Asan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 17/380,308

(22) Filed: Jul. 20, 2021

(65) Prior Publication Data

US 2022/0019148 A1 Jan. 20, 2022

(30) Foreign Application Priority Data

Jul. 20, 2020 (KR) .......................... 10-2020-0089888

(51) Int. Cl.
*G03F 7/20* (2006.01)
(52) U.S. Cl.
CPC ................ *G03F 7/70341* (2013.01)
(58) Field of Classification Search
CPC .......... G03F 7/70341; G03F 7/16; G03F 7/38; G03F 7/40
See application file for complete search history.

(56) References Cited

U.S. PATENT DOCUMENTS

| 10,289,005 | B2 * | 5/2019 | Lee | ........................... G03F 7/40 |
| 2017/0372922 | A1 * | 12/2017 | Jung | ................... H01L 21/6715 |

FOREIGN PATENT DOCUMENTS

| JP | 2012-70002 A | 4/2012 |
| KR | 10-1998-0018735 A | 6/1998 |
| KR | 10-2006-0053145 A | 5/2006 |
| KR | 10-2012-0116352 A | 10/2012 |
| KR | 10-1769440 | 8/2017 |

\* cited by examiner

*Primary Examiner* — Hung Nguyen
(74) *Attorney, Agent, or Firm* — Harness, Dickey & Pierce, P.L.C.

(57) ABSTRACT

The inventive concept provides a substrate treating apparatus and a substrate treating method. The sub substrate treating apparatus may include a support unit that supports a substrate, a liquid supply unit that supplies a liquid onto the substrate supported by the support unit, and a controller that controls the liquid supply unit and the support unit, the liquid supply unit may include a pre-treatment nozzle that discharges a first treatment liquid in a stream scheme, and a main nozzle that discharges a second treatment liquid in a liquid curtain scheme, and the controller may control the support unit such that a rotational direction of the substrate when the first treatment liquid is discharged from the main nozzle and a rotational direction of the substrate when the second treatment liquid is discharged from the pre-treatment nozzle are opposite to each other.

20 Claims, 16 Drawing Sheets

FIG. 1
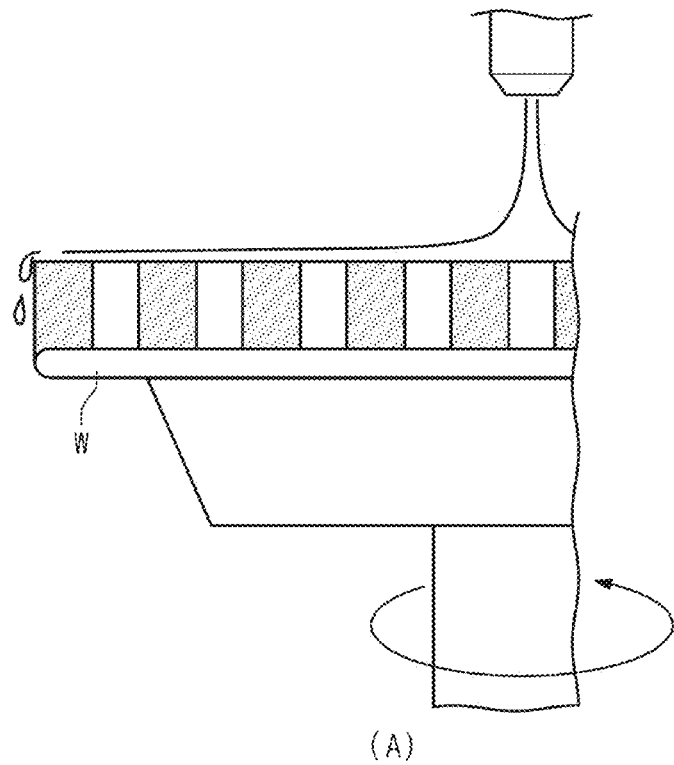
(A)
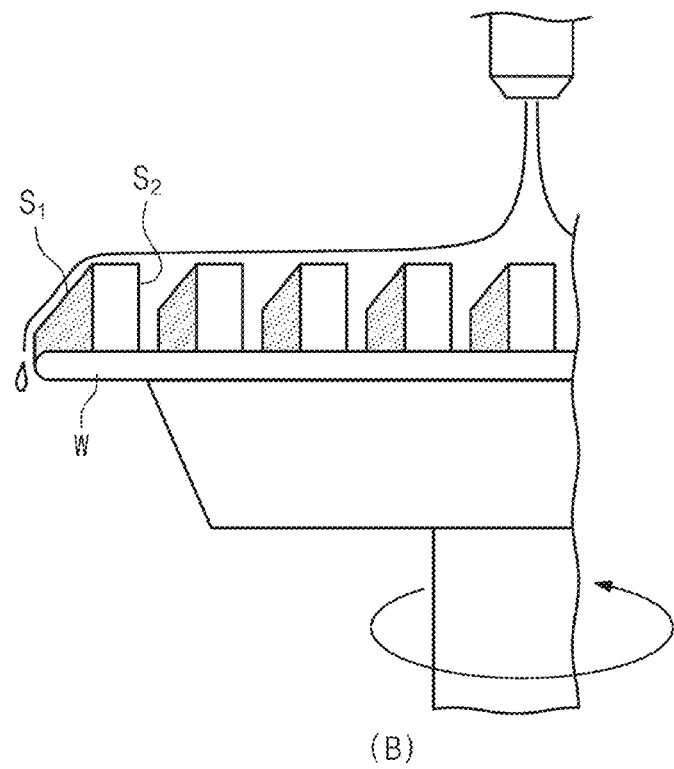
(B)

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2020-0089888 filed on Jul. 20, 2020, in the Korean Intellectual Property Office, the entire contents of which are hereby incorporated by reference.

BACKGROUND

Embodiments of the inventive concept described herein relate to a substrate treating apparatus and a substrate treating method.

A process of manufacturing a semiconductor device and a flat panel display panel includes various processes including a photographing process, an etching process, an ashing process, a thin film deposition process, and a cleaning process. Among the processes, in the photographing process, application, exposure, and development steps are sequentially performed. The application process is a process of applying a photosensitive liquid such as a resist onto a surface of a substrate. The exposure process is a process of exposing a circuit pattern on a substrate in which a photosensitive film is formed. The development process is a process of selectively developing a pattern of the exposed substrate.

In general, in the development process, a photosensitive film is removed by supplying a development liquid from a nozzle onto a substrate that rotates. A nozzle used in the development process is largely one of a stream nozzle and a slit nozzle. The stream nozzle has a circular discharge hole, and the slit nozzle has a slit-shaped discharge hole.

When a substrate is liquid-treated by using the nozzles, there are different disadvantages. When the substrate is liquid-treated by using the stream nozzle, a thin liquid film of the development is formed as compared with the slit nozzle. Accordingly, when the stream nozzle is used, a time consumed for the development process is long as compared with the slit nozzle. Furthermore, when the substrate is liquid-treated by using the slit nozzle, many stains are generated in the substrate as compared with the stream nozzle. Accordingly, when the slit nozzle is used, the development efficiency may be low as compared with the stream nozzle.

Furthermore, as the substrate is continuously rotated in the same direction when the rotating substrate is liquid-treated, the photosensitive film may reside while having an inclination. For example, when the substrate continues to rotate in the same direction during the development process, as illustrated in FIG. 1, the photosensitive film "A" is peeled at a specific inclination and thus slopes of patterns of the substrate become different. According to a rotational direction of the substrate, the slopes of one side S1 and an opposite side S2 of a single pattern become different. Accordingly, the photosensitive film "A" resides on the one side S1, and thus the development efficiency of the substrate is lowered. In particular, when the viscosity of the development liquid is high, the differences of the slopes in the pattern become significant.

SUMMARY

Embodiments of the inventive concept provide an apparatus and a method for improving an efficiency of a liquid treating process of a substrate.

Embodiments of the inventive concept also provide an apparatus and a method for supplement disadvantages that occur when a substrate is liquid-treated by using a stream nozzle and a slit nozzle, respectively.

Embodiments of the inventive concept also provide an apparatus and a method for preventing a phenomenon, in which slopes of a pattern become different when a substrate is liquid-treated.

The aspect of the inventive concept is not limited thereto, and other unmentioned aspects of the present invention may be clearly appreciated by those skilled in the art from the following descriptions.

The inventive concept provides a substrate treating apparatus.

In an example, the sub substrate treating apparatus may include a support unit that supports a substrate, a liquid supply unit that supplies a liquid onto the substrate supported by the support unit, and a controller that controls the liquid supply unit and the support unit, the liquid supply unit may include a pre-treatment nozzle that discharges a first treatment liquid in a stream scheme, and a main nozzle that discharges a second treatment liquid in a liquid curtain scheme, and the controller may control the support unit such that a rotational direction of the substrate when the first treatment liquid is discharged from the main nozzle and a rotational direction of the substrate when the second treatment liquid is discharged from the pre-treatment nozzle are opposite to each other.

In an example, the controller may control the liquid supply unit such that the pre-treatment nozzle discharges the first treatment liquid onto the substrate at a location corresponding to a central area of the substrate.

In an example, the liquid supply unit may further include a support body, on which the main nozzle is mounted, a support arm connected to the support body to be movable, and a driver that moves the support arm, and the controller may control the driver such that the second treatment liquid is discharged onto the substrate while a spotting point of the main nozzle is changed from a central area of the substrate to an edge area of the substrate.

In an example, the controller may control the driver such that a movement speed of the main nozzle varies while the spotting point of the main nozzle is changed from the central area of the substrate to the edge area of the substrate.

In an example, the controller may control the driver such that the movement speed of the main nozzle is slow in, among all areas of the substrate, an area, in which an aspect ratio of a pattern formed on the substrate is high.

In an example, the controller may control the support unit such that the substrate is rotated at a first speed when the pre-treatment nozzle discharges the first treatment liquid onto the substrate, the substrate is rotated at a second speed when the main nozzle discharges the second treatment liquid onto the substrate, and the first speed is higher than the second speed.

In an example, the liquid supply unit may further include a first treatment liquid supply line, in which a first valve is installed, and that supplies the first treatment liquid to the pre-treatment nozzle, and a second treatment liquid supply line, in which a second valve is installed, and that supplies the second treatment liquid to the main nozzle, and the controller may control the first valve and the second valve such that the pre-treatment nozzle discharges the first treatment liquid and thereafter, the main nozzle discharges the second treatment liquid.

In an example, the liquid supply unit may further include a rinsing liquid nozzle that supplies a rinsing liquid onto the substrate, and a rinsing liquid supply line, in which a third valve is installed, and that supplies the rinsing liquid to the rinsing liquid nozzle, and the controller may control the support unit such that the substrate is rotated at a third speed when the ringing liquid nozzle discharges the rinsing liquid onto the substrate, and the second speed is lower than the first speed and the third speed.

In an example, the controller may control the third valve such that the main nozzle discharges the second treatment liquid onto the substrate and thereafter, the rinsing liquid nozzle discharges the rinsing liquid.

In an example, the pre-treatment nozzle may discharge the first treatment liquid in a vertically downward direction, and the main nozzle may discharge the second treatment liquid in a downwardly inclined direction.

In an example, the first treatment liquid and the second treatment liquid may be the same liquid.

In an example, the first treatment liquid and the second treatment liquid may include a development liquid.

According to another aspect, a substrate treating apparatus may include a support unit that supports a substrate, a liquid supply unit that discharges a treatment liquid onto the substrate supported by the support unit, and a controller that controls the liquid supply unit and the support unit, the liquid supply unit may include a pre-treatment nozzle having a stream discharge hole and that discharges the treatment liquid in a stream scheme, and a main nozzle having a slit discharge hole and that discharges the treatment liquid in a liquid curtain scheme, the stream may discharge hole has a circular shape, and the slit discharge hole has a slit shape, and the controller may control the support unit such that a rotational direction of the substrate when the treatment liquid is discharged from the main nozzle and a rotational direction of the substrate when the treatment liquid is discharged from the pre-treatment nozzle are opposite to each other.

In an example, the liquid supply unit may further include a support body, on which the pre-treatment nozzle and the main nozzle are mounted.

In an example, the slit discharge hole may have a lengthwise direction that faces a first direction, and the main nozzle and the pre-treatment nozzle may be disposed along a second direction that is perpendicular to the first direction when viewed from a top.

In an example, a length of the slit discharge hole may be smaller than a radius of the substrate supported by the support unit.

In an example, the slit discharge hole may be downwardly inclined in a direction that faces the pre-treatment nozzle.

In an example, an end of the slit discharge hole may be located to be higher than an end of the stream discharge hole.

In an example, the liquid supply unit may further include a rinsing liquid nozzle that discharges a rinsing liquid onto the substrate, and a nozzle body, on which the rinsing liquid nozzle is mounted.

In an example, the controller may control the liquid supply unit such that, after the pre-treatment nozzle supplies the treatment liquid onto the substrate, the main nozzle supplies the treatment liquid onto the substrate, and thereafter, the rinsing liquid nozzle supplies the rinsing liquid onto the substrate.

Furthermore, the inventive concept provides a substrate treating method. In an example, a method for liquid-treating a substrate by discharging a liquid onto the substrate that rotates includes a pre-treatment operation of supplying, by a pre-treatment nozzle, a treatment liquid onto the substrate in a stream scheme, and a main treatment operation of supplying, a main nozzle, the treatment liquid onto the substrate in a liquid curtain scheme, and a rotational direction of the substrate in the pre-treatment operation and a rotational direction of the substrate in the main treatment operation may be opposite to each other.

In an example, in the pre-treatment operation, the treatment liquid may be discharged at a location corresponding to a central area of the substrate.

In an example, in the main treatment operation, the treatment liquid may be discharged while a spotting point is changed from the central area of the substrate to an edge area of the substrate.

In an example, in the main treatment operation, a movement speed of the main nozzle may vary.

In an example, in the main treatment operation, the movement speed of the main nozzle may be slow in, among all areas of the substrate, an area having a high aspect ratio of a pattern formed on the substrate.

In an example, the substrate may be rotated at a first speed in the pre-treatment operation, the substrate may be rotated at a second speed in the main treatment operation, and the first speed may be higher than the second speed.

In an example, the pre-treatment operation may further include an initial pre-treatment operation of rotating the substrate at a speed of an initial pre-treatment, a late pre-treatment operation of rotating the substrate at a speed of a late pre-treatment after the initial pre-treatment operation, and the speed of the late pre-treatment may be higher than the speed of the initial pre-treatment.

In an example, a middle pre-treatment operation of rotating the substrate to a speed of a middle pre-treatment may be further included between the initial pre-treatment operation and the late pre-treatment operation, and the speed of the middle pre-treatment may be lower than the speed of the initial pre-treatment.

In an example, the main treatment operation may further include an initial main treatment operation of rotating the substrate at a speed of an initial main treatment, a middle main treatment operation of rotating the substrate to a speed of a middle main treatment after the initial main treatment operation, and a late pre-treatment operation of rotating the substrate at a speed of a late main treatment after the middle main treatment operation, and the speed of the middle main treatment may be lower than the speed of the initial main treatment and the late main treatment.

In an example, the speed of the initial main treatment and the speed of the late main treatment may be the same.

In an example, the speed of the initial main treatment and the speed of the late main treatment may be higher than the speed of the middle main treatment.

In an example, a rinsing liquid supplying operation of supplying a rinsing liquid onto the substrate may be further included after the main treatment operation is performed, and in the rinsing liquid supplying operation, the substrate may be rotated at a third speed and the second speed may be lower than the first speed and the third speed.

In an example, the third speed may be higher than the second speed.

In an example, in the rinsing liquid supplying operation, the rotational speed of the substrate may vary.

In an example, the rinsing liquid supplying operation may further include a first rotation operation of rotating the substrate at a first rotational speed, and a second rotation operation of rotating the substrate at a second rotational speed that is lower than the first rotational speed, and the first rotation operation and the second rotation operation may be sequentially repeated.

In an example, in the pre-treatment operation, the treatment liquid is discharged in a vertically downward direction, and in the main treatment operation, the treatment liquid may be discharged in a downwardly inclined direction.

In an example, the treatment liquid may be a development liquid.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 1 is a view schematically illustrating an embodiment of a general development;

DETAILED DESCRIPTION

Hereinafter, embodiments of the inventive concept will be described in more detail with reference to the accompanying drawings. The embodiments of the inventive may be modified in various forms, and the scope of the inventive concept should not be construed to be limited to the following embodiments. The embodiments of the inventive concept are provided to describe the present inventive for an ordinary person skilled in the art more completely. Accordingly, the shapes of the components of the drawings are exaggerated to emphasize clearer description thereof.

The system of the present embodiment of the inventive concept may be used to perform a photography process on a substrate such as a semiconductor substrate or a flat display panel. In particular, the system of the present embodiment may be connected to an exposure apparatus to perform an application process and a development process on a substrate. Hereinafter, a case of using a substrate as a substrate may be described as an example.

Figure 2:
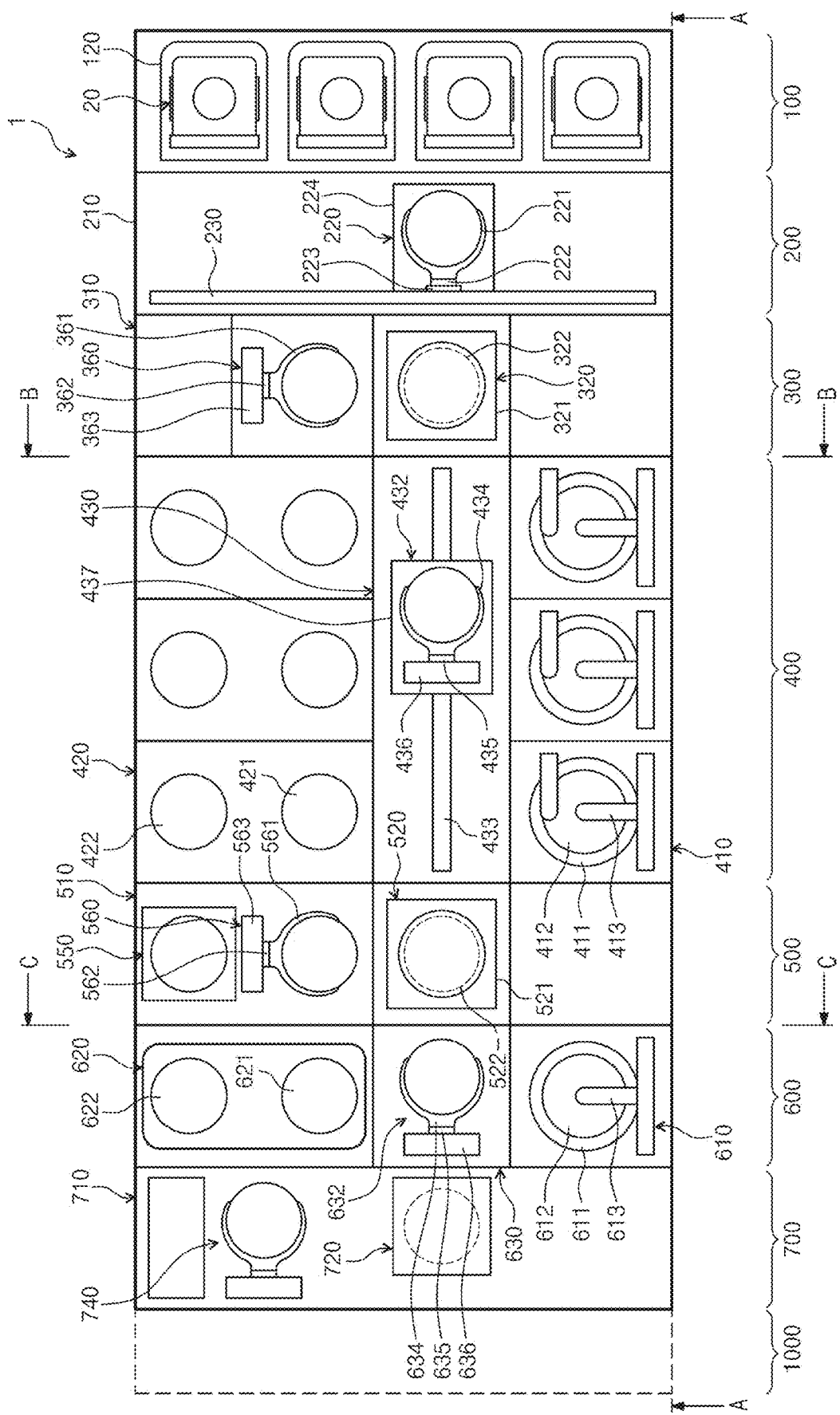
FIG. 2 is a plan view illustrating a substrate treating system according to an embodiment of the inventive concept.
Figure 3:
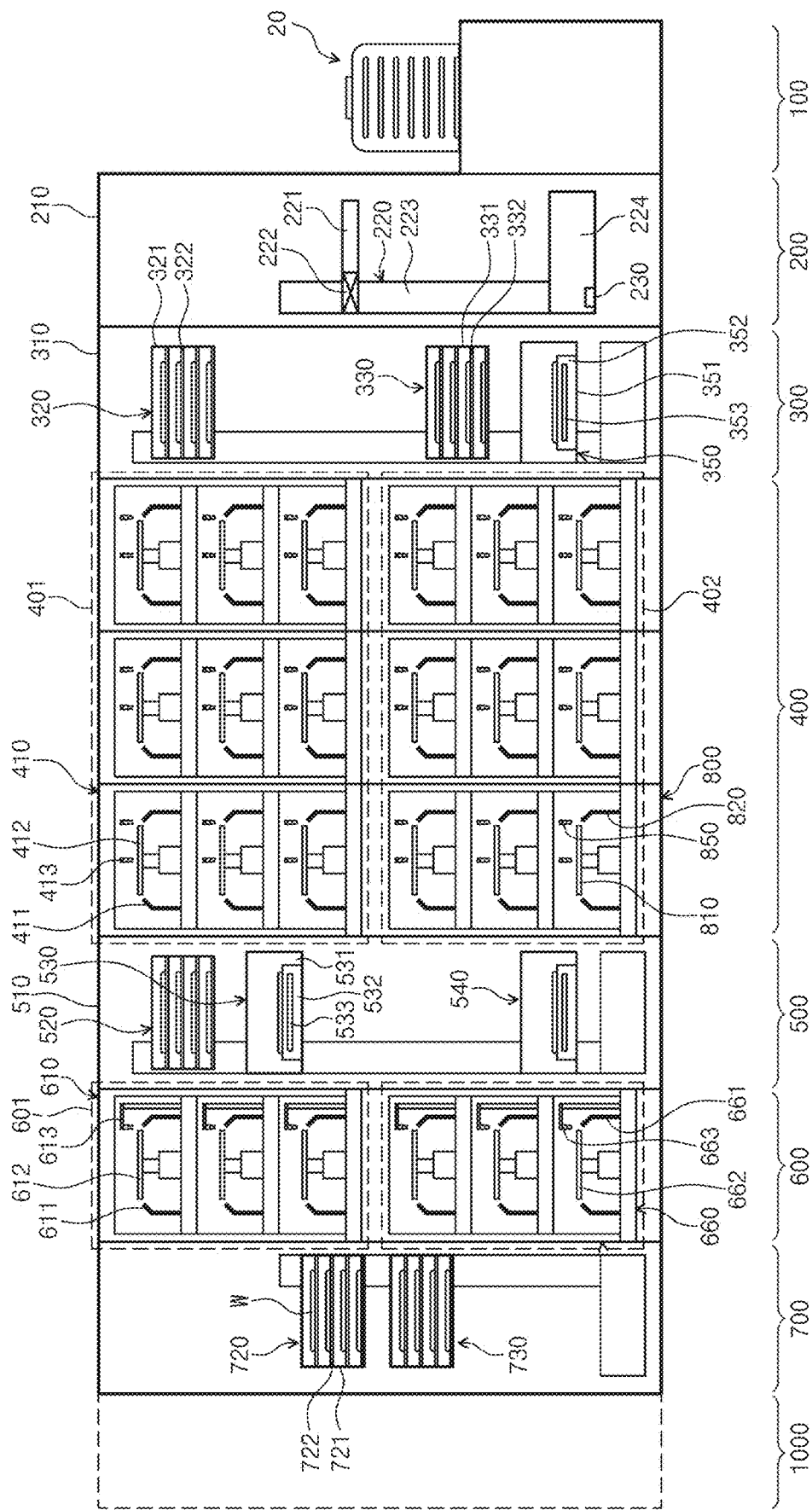
FIG. 3 is a sectional view of the system of FIG. 2, taken along a line A-A of FIG. 2.
Figure 4:
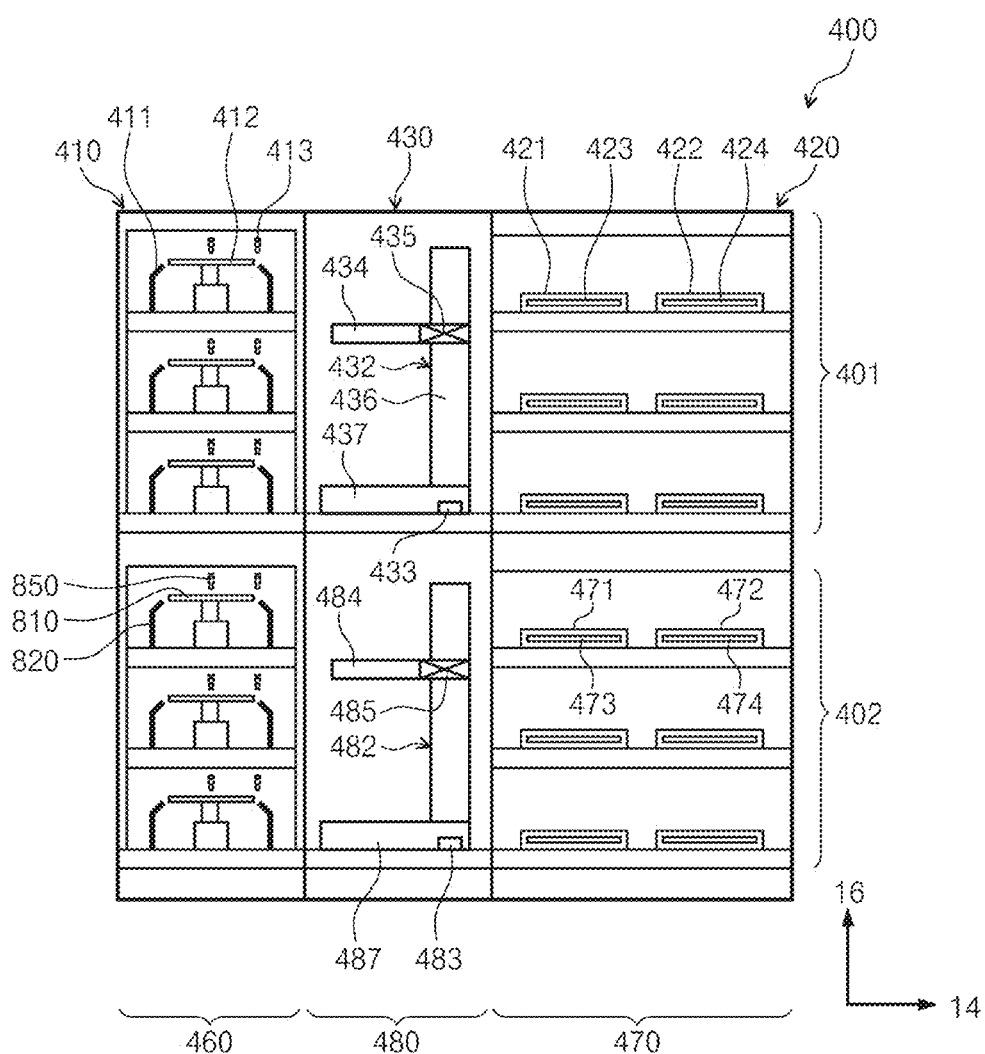
FIG. 4 is a sectional view of the system of FIG. 2, taken along line B-B of FIG. 1.
Figure 5:
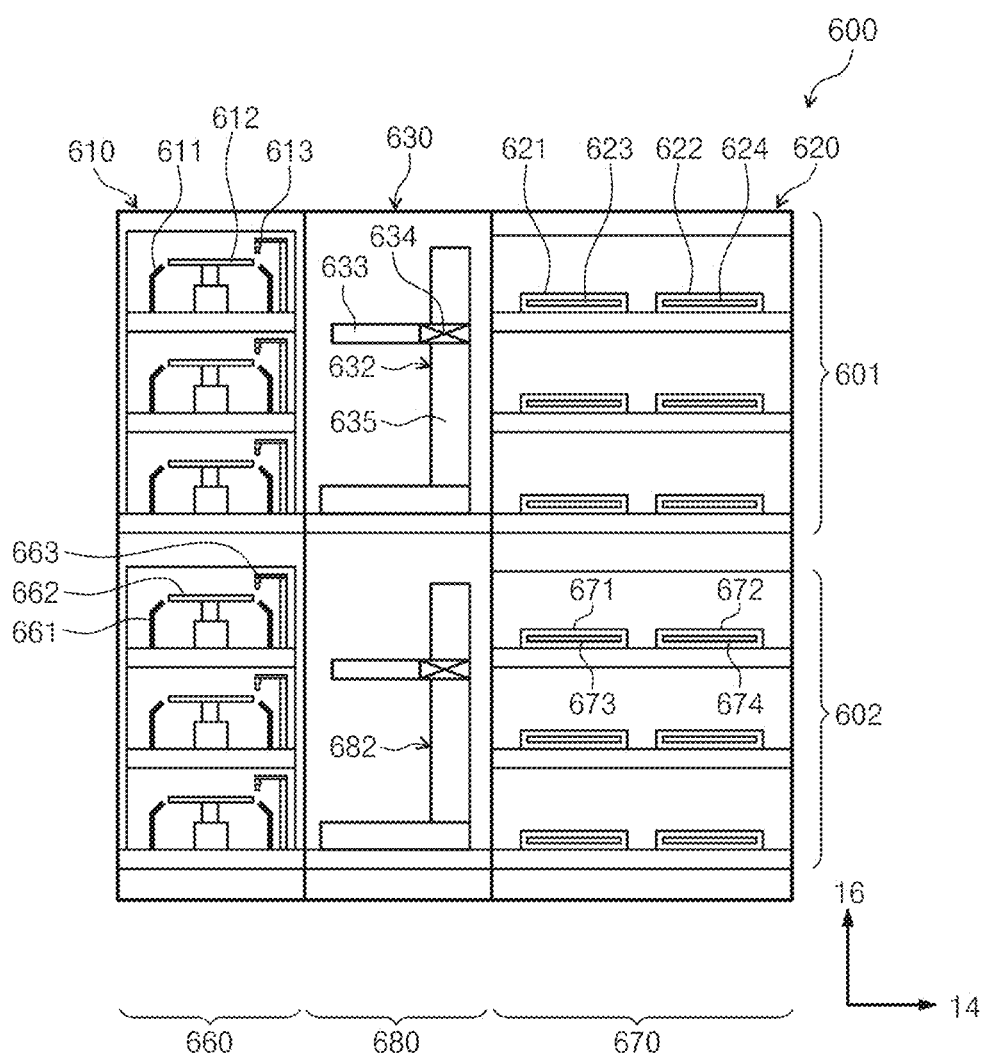
FIG. 5 is a sectional view of the system of FIG. 2, taken along a line C-C of FIG. 2.

FIG. 2 is a plan view of a substrate treating system according to an embodiment of the inventive concept. FIG. 3 is a sectional view of the system of FIG. 2, taken along a line A-A of FIG. 2. FIG. 4 is a cross-sectional view of the system of FIG. 2, taken along line B-B of FIG. 1. FIG. 5 is a sectional view of the system of FIG. 2, taken along a line C-C of FIG. 2.

Referring to FIGS. 2 to 5, the substrate treating system 1 includes a load port 100, an index module 200, a first buffer module 300, an application/development module 400, a second buffer module 500, a pre/post-exposure treating module 600, and an interface module 700. The load port 100, the index module 200, the first buffer module 300, the application/development module 400, the second buffer module 500, the pre/post-exposure treating module 600, and the interface module 700 are sequentially disposed in a row in one direction.

Hereinafter, a direction in which the load port 100, the index module 200, the first buffer module 300, the application/development module 400, the second buffer module 500, the pre/post-exposure treating module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate "W" is moved while being received in a cassette 20. Then, the cassette 20 has a structure that is sealed from the outside. For example, a front open unified pod (FOUP) that has a door on the front side may be used as the cassette 20.

Hereinafter, the load port 100, the index module 200, the first buffer module 300, the application/development module 400, the second buffer module 500, the pre/post-exposure treating module 600, and the interface module 700 will be described in detail.

The load port 100 has a carrier 120 on which the cassette 20, in which the substrates "W" are received, is positioned. A plurality of carriers 120 are provided, and are disposed along the second direction 14 in a row. In FIG. 3, four carriers 120 are provided.

The index module 200 feeds a substrate "W" between the cassette 20 positioned on the carrier 120 of the load port 100 and the first buffer module 300. The index module 200 has a frame 210, an index robot 220, and a guide rail 230. The frame 210 has a substantially rectangular parallelepiped shape having an empty interior, and is disposed between the load part 100 and the first buffer module 300. The frame 210 of the index module 200 may have a height smaller than that of a frame 310 of the first buffer module 300, which will be described below. The index robot 220 and the guide rail 230 are disposed in the frame 210. The index robot 220 has a four-axis driven structure such that a hand 221 that directly handles a substrate "W" is movable and rotatable in the first direction 12, the second direction 14, and the third direction 16. The index robot 220 has a hand 221, an arm 222, a support 223, and a prop 224. The hand 221 is fixedly installed in the arm 222. The arm 222 has a flexible and rotatable structure. The support 223 is configured such that the lengthwise direction thereof is disposed along the third direction 16. The arm 222 is coupled to the support 223 to be movable along the support 223. The support 223 is fixedly coupled to the prop 224. The guide rail 230 is provided such that the lengthwise direction thereof is disposed along the second direction 14. The prop 224 is coupled to the guide rail 230 to be linearly movable along the guide rail 230. Although not illustrated, the frame 210 is further provided with a door opener that opens and closes a door of the cassette 20.

The first buffer module 300 has a frame 310, a first buffer 320, a second buffer 330, a cooling chamber 350, and a first buffer robot 360. The frame 310 has a rectangular parallelepiped shape having an empty interior, and is disposed between the index module 200 and the application/development module 400. The first buffer 320, the second buffer 330, the cooling chamber 350, and the first buffer robot 360 are situated within the frame 310. The cooling chamber 350, the second buffer 330, and the first buffer 320 are disposed along the third direction 16 sequentially from the bottom. The first buffer 320 is situated at a height corresponding to an application module 401 of the application/development module 400, which will be described below, and the second buffer 330 and the cooling chamber 350 are situated at a height corresponding to a development module 402 of the application/development module 400, which will be described below. The first buffer robot 360 is spaced apart by a predetermined distance in the second direction 14 from the second buffer 330, the cooling chamber 350, and the first buffer 320.

The first buffer 320 and the second buffer 330 temporarily preserve a plurality of substrates "W". The second buffer 330 has a housing 331 and a plurality of supports 332. The supports 332 are disposed within the housing 331, and are spaced apart from one another along the third direction 16. One substrate "W" is positioned on each of the supports 332. The housing 331 has openings (not illustrated) on a side on which the index robot 220 is provided, on a side on which the first buffer robot 360 is provided, and on a side on which a development robot 482 is provided so that the index robot 220, the first buffer robot 360, and a development robot 482 of the development module 402, which will be described below, carries a substrate "W" into or out of the support 332 in the housing 331. The first buffer 320 has a structure that is substantially similar to that of the second buffer 330. Meanwhile, the housing 321 of the first buffer 320 has an opening on a side on which the first buffer robot 360 is provided and on a side on which an application robot 432 situated in the application module 401, which will be described below, is provided. The number of supports 322 provided for the first buffer 320 and the number of supports 332 provided for the second buffer 330 may be the same or different. According to an embodiment, the number of the supports 332 provided for the second buffer 330 may be larger than the number of the supports 332 provided for the first buffer 320.

The first buffer robot 360 feeds a substrate "W" between the first buffer 320 and the second buffer 330. The first buffer robot 360 has a hand 361, an arm 362, and a support 363. The hand 361 is fixedly installed in the arm 362. The arm 362 has a flexible structure, and allows the hand 361 to be moved along the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downwards. The first buffer robot 360 may be provided such that the hand 361 is simply two-axis driven along the second direction 14 and the third direction 16.

The cooling chamber 350 cools a substrate "W". The cooling chamber 350 has a housing 351 and a cooling plate 352. The cooling plate 352 has a cooling unit 353 that cools an upper surface thereof on which a substrate "W" is positioned and the substrate "W". Various types such as a cooling type using cooling water and a cooling type using a thermoelectric element may be used as the cooling unit 353.

A lift pin assembly (not illustrated) that locates a substrate "W" on the cooling plate 352 may be provided in the cooling chamber 350. The housing 351 has openings (not illustrated) on a side on which the index robot 220 is provided and on a side on which the development robot 482 is provided so that the index robot 220 and the development robot 482 provided for the development robot 402, which will be described below, carry a substrate "W" into or out of the cooling plate 352. Doors (not illustrated) that open and close the aforementioned openings may be provided in the cooling chamber 350.

The application/development module 400 performs a process of applying a photoresist onto a substrate "W" before an exposure process and a process of developing the substrate "W" after the exposure process. The application/development module 400 has a substantially rectangular parallelepiped shape. The application/development module 400 has an application module 401 and a development module 402. The application module 401 and the development module 402 may be disposed to be partitioned from each other in different layers. According to an example, the application module 401 is situated on the development module 402.

The application module 401 performs a process of applying a photosensitive liquid such as a photoresist onto a substrate "W" and a heat treating process of, for example, heating and cooling the substrate "W" before and after the resist applying process. The application module 401 has a resist applying chamber 410, a bake chamber 420, and a carrying chamber 430. The resist applying chamber 410, the bake chamber 420, and the carrying chamber 430 are sequentially disposed along the second direction 14. Accordingly, the resist applying chamber 410 and the bake chamber 420 are spaced apart from each other in the second direction 14 while the carrying chamber 430 is interposed therebetween. A plurality of resist applying chambers 410 may be provided, and a plurality of resist applying chambers 410 may be provided in each of the first direction 12 and the third direction 16. In the drawings, six resist applying chambers 410 are illustrated as an example. A plurality of bake chamber 420 may be provided in each of the first direction 12 and the third direction 16. In the drawings, six bake chambers 420 are illustrated as an example. However, unlike this, a larger number of bake chambers 420 may be provided.

The carrying chamber 430 is situated in parallel to the first buffer 320 of the first buffer module 300 in the first direction 12. An application robot 432 and a guide rail 433 may be situated in the carrying chamber 430. The carrying chamber 430 has a substantially rectangular shape. The application robot 432 feeds a substrate "W" between the bake chambers 420, the resist applying chambers 410, the first buffer 320 of the first buffer module 300, and the first cooling chamber 530 of the second buffer module 500. The guide rail 433 is disposed such that the lengthwise direction thereof is parallel to the first direction 12. The guide rail 433 is disposed such that the lengthwise direction thereof is parallel to the first direction 12. The application robot 432 has a hand 434, an arm 435, a support 436, and a prop 437. The hand 434 is fixedly installed in the arm 435. The arm 435 has a flexible structure such that the hand 434 is movable horizontally. The support 436 is provided such that the lengthwise direction thereof is disposed along the third direction 16. The arm 435 is coupled to the support 436 to be linearly movable in the third direction 16 along the support 436. The support 436 is fixedly coupled to the prop 437, and the prop 437 is coupled to the guide rail 433 to be movable along the guide rail 433.

The resist applying chambers 410 have the same structure. However, the types of photoresists used in the resist applying chambers 410 may be different. As an example, the photoresist may be a chemical amplification resist. The resist applying chamber 410 applies a photoresist onto the substrate "W". The resist applying chamber 410 has a housing 411, a support plate 412, and a nozzle 413. The housing 411 has an open-topped cup shape. The support plate 412 is situated in the housing 411, and supports the substrate "W". The support plate 412 may be provided to be rotatable. The nozzle 413 supplies a photoresist onto the substrate "W" positioned on the support plate 412. The nozzle 413 has a circular pipe shape, and may supply a photoresist to the center of the substrate "W". Optionally, the nozzle 413 may have a length corresponding to the diameter of the substrate "W", and the discharge hole of the nozzle 413 may be a slit. Further, additionally, a nozzle 414 for supplying a cleaning liquid such as deionized water to clean a surface of the substrate "W", to which the photoresist is applied, may be further provided in the resist applying chamber 410.

The bake chamber 420 heat-treats the wafer "W". For example, the bake chambers 420 perform a prebake process of eliminating organic substances and moisture on the surface of the wafer "W" by heating the wafer "W" at a predetermined temperature before a photoresist is applied or a soft bake process performed after a photoresist is applied onto the wafer "W", and performs a cooling process of cooling the wafer "W" after the heating processes. The bake chamber 420 has a cooling plate 421 and a heating plate 422. The cooling plate 421 is provided with a cooling unit 423 such as cooling water or a thermoelectric element. The heating plate 422 is provided with a heating unit 424 such as a heating wire or a thermoelectric element. The cooling plate 421 and the heating plate 422 may be provided in one bake chamber 420. Optionally, some of the bake chambers 420 may include only a cooling plate 421, and some of the bake chambers 420 may include only a heating plate 422.

The development module 402 includes a process of eliminating a photoresist by supplying a development liquid to obtain a pattern on the substrate "W", and a heat treating process, such as heating and cooling, which are performed on the substrate "W" before and after the development process. The development module 402 has a development chamber 800, a bake chamber 470, and a carrying chamber 480. The development chamber 800, the bake chamber 470, and the carrying chamber 480 are sequentially disposed along the second direction 14. Accordingly, the development chamber 800 and the bake chamber 470 are spaced apart from each other in the second direction 14 while the carrying chamber 480 is interposed therebetween. A plurality of development chambers 800 may be provided, and a plurality of development chambers 460 may be provided in each of the first direction 12 and the third direction 16. In the drawings, six development chambers 800 are illustrated as an example. A plurality of bake chamber 470 may be provided in each of the first direction 12 and the third direction 16. In the drawings, six bake chambers 470 are illustrated as an example. However, unlike this, a larger number of bake chambers 470 may be provided.

The carrying chamber 480 is situated in parallel to the second buffer 330 of the first buffer module 300 in the first direction 12. A development robot 482 and a guide rail 483 may be situated in the carrying chamber 480. The carrying chamber 480 has a substantially rectangular shape. The development robot 482 feeds the substrate "W" between the bake chambers 470, the development chambers 800, the second buffer 330 and the cooling chamber 350 of the first buffer module 300, and the second cooling chamber 540 of the second buffer module 500. The guide rail 483 is disposed such that the lengthwise direction thereof is parallel to the first direction 12. The guide rail 483 guides the development robot 482 such that the development robot 482 is linearly moved in the first direction 12. The development robot 482 has a hand 484, an arm 485, a support 486, and a prop 487. The hand 484 is fixedly installed in the arm 485. The arm 485 has a flexible structure such that the hand 484 is movable horizontally. The support 486 is provided such that the lengthwise direction thereof is disposed along the third direction 16. The arm 485 is coupled to the support 486 to be linearly movable in the third direction 16 along the support 486. The support 486 is fixedly coupled to the prop 487. The prop 487 is coupled to the guide rail 483 to be linearly movable along the guide rail 483.

The development chambers 800 have the same structure. However, the types of development liquids used in the development chambers 800 may be different. The development chambers 800 are provided as an apparatus for development a substrate. The development chambers 800 eliminate an area of the photoresist on the substrate "W", to which light is irradiated. Then, an area of the protective film, to which light is irradiated, is eliminated together. Optionally, only an area of the photoresist and the protective film, to which light is not irradiated, may be eliminated according to the type of the used photoresist. In the embodiment, the development chambers 800 are provided as the substrate treating apparatus 800 for liquid-treating the substrate "W".

Figure 6:
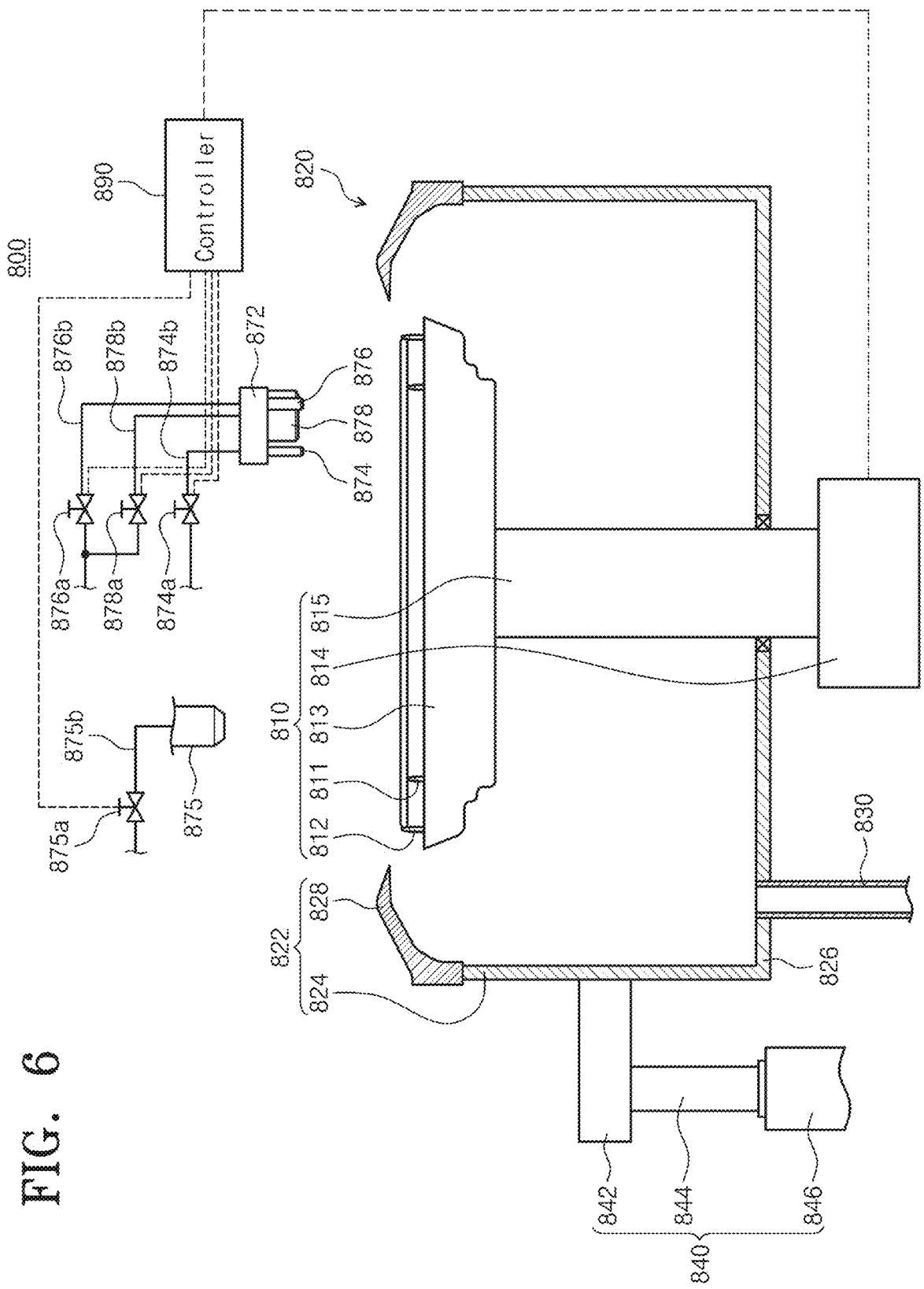
FIG. 6 is a sectional view illustrating the substrate treating apparatus of FIG. 2.
Figure 7:
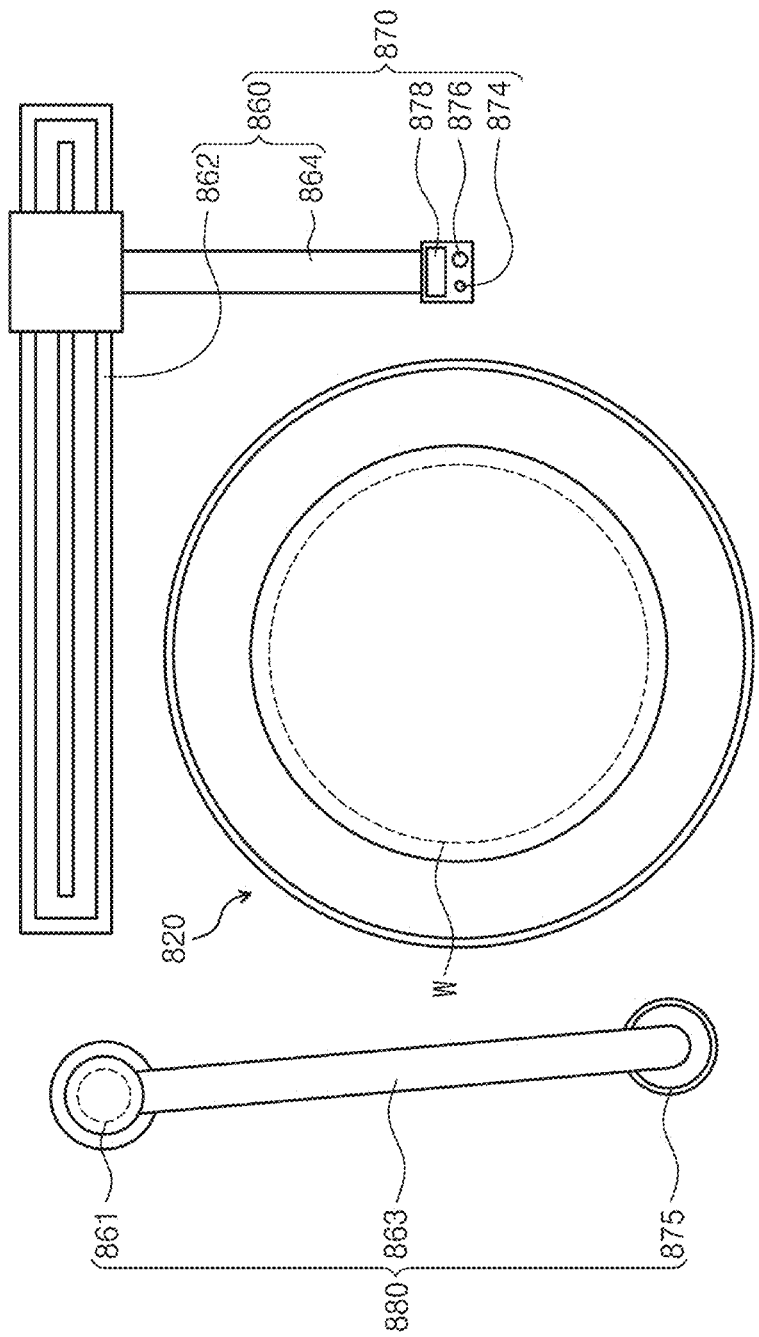
FIG. 7 is a plan view illustrating the substrate treating apparatus of FIG. 6.

FIG. 6 is a sectional view illustrating the substrate treating apparatus of FIG. 2. FIG. 7 is a plan view illustrating the substrate treating apparatus of FIG. 6. Referring FIGS. 6 and 7, the substrate treating apparatus 800 includes a support unit 810, a treatment container 820, an elevation unit 840, a liquid supply unit 850, and a controller 890.

The support unit 810 supports and rotates the substrate "W". The support unit 810 includes a support plate 813, a rotary shaft 814, and a driving member 815. Pin members 811 and 812 that support the substrate "W" are coupled to an upper surface of the support plate 813. Some 811 of the pin members support a bottom surface of the substrate "W", and others 812 of the pin members support a side surface of the substrate "W". The rotary shaft 814 is provided such that a lengthwise direction of the rotary shaft 814 has a cylindrical shape that faces an upward/downward direction. The rotary shaft 814 is coupled to a bottom surface of the support plate 813. The driving member 815 provides a rotational force to the rotary shaft 814. The rotary shaft 814 may be rotated about a central axis thereof by the driver member 815. The support plate 813 may be rotated together with the rotary shaft 814. A rotational speed of the rotary shaft 814 is adjusted by the driver 815 so that a rotational speed of the substrate "W" may be adjusted. For example, the driver 815 may be a motor.

The treatment container 820 has a treatment space, in which a development process is performed, in the interior thereof. The treatment container 820 recovers a treatment liquid used in the development process. The treatment container 820 includes an inner recovery vessel 822 and a recovery line 830. The recovery vessel 822 includes a vertical wall 824, a bottom wall 826, and an inclined wall 828. The vertical wall 824 is provided to have an annular ring shape that surrounds the support unit 810. The vertical wall 824 may have a diameter that is spaced apart from the support unit 810. The vertical wall 824 may be located such that the central axis thereof coincides with the support unit 810. The bottom wall 826 extends from a lower end of the vertical wall 824. The bottom wall 826 faces a horizontal direction that faces the central axis of the support unit 810. The inclined wall 828 extends from an upper end of the vertical wall 824. The inclined wall 828 faces an upwardly inclined direction as it becomes closer to the central axis of the support unit 810. Selectively, the inclined wall 828 may face a horizontal direction.

The recovery line 830 discharges the treatment liquid recovered into the treatment space, to the outside. The recovery line 830 is connected to the bottom wall 826. The discharged treatment liquid may be provided to an external regeneration system through the recovery line 830.

The elevation unit 840 adjusts a relative height between the container 820 and the support unit 810. The elevation unit 840 moves the container 820 upwards and downwards. The elevation unit 840 includes a bracket 842, a movable shaft 844, and a driver 846. The bracket 842 connects the treatment container 820 and the movable shaft 844. The bracket 842 is fixedly installed in the vertical wall 824 of the treatment container 820. The movable shaft 844 is provided such that a lengthwise direction of the movable shaft 844 faces a vertical direction. An upper end of the movable shaft 844 is fixedly coupled to the bracket 842. The movable shaft 844 may be moved vertically by the driver 846, and the treatment space 820 may be elevated together with the movable shaft 844. For example, the driver 846 may be a motor.

Figure 8:
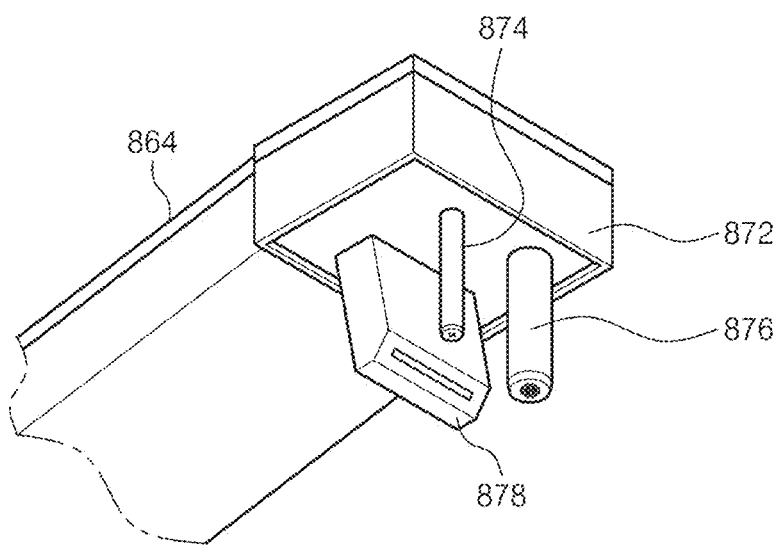
FIG. 8 is a perspective view illustrating a nozzle unit of FIG. 6.

The first nozzle unit 870 discharges various kinds of liquids. FIG. 8 is a perspective view illustrating a nozzle unit of FIG. 6. Referring to FIG. 8, the first nozzle unit 870 includes a support body 872, a wetting nozzle 874, a pre-treatment nozzle 876, and a main nozzle 878. The support body 872 supports the wetting nozzle 874, the pre-treatment nozzle 876, and the main nozzle 878. The support body 872 is fixedly coupled to a bottom surface of one end of the support arm 864. The wetting nozzle 874, the pre-treatment nozzle 876, and the main nozzle 878 are fixedly coupled to a bottom surface of the support body 872.

The pre-treatment nozzle 876 discharges the treatment liquid in a stream scheme. The pre-treatment nozzle 876 is connected to the first treatment liquid supply line 876b. A first valve 876a is installed in the first treatment liquid supply line 876b to adjust whether the treatment liquid is to be supplied to the pre-treatment nozzle 876 or an amount of the treatment liquid that is to be supplied. The pre-treatment nozzle 876 receives the treatment liquid from the first treatment liquid supply line 876b and discharges the treatment liquid. The pre-treatment nozzle 876 has a circular stream discharge hole. The stream discharge hole faces a vertically downward direction. In an example, the pre-treatment nozzle 876 may be a stream nozzle. As an example, the treatment liquid may be a development liquid.

The main nozzle 878 discharges the treatment liquid to in a liquid curtain scheme. The main nozzle 878 is located on one side of the pre-treatment nozzle 876. The main nozzle 878 is located to face the pre-treatment nozzle 876. The main nozzle 878 is connected to a second treatment liquid supply line 878b. The second valve 878a adjusts whether the treatment liquid is to be supplied to the main nozzle 878 or an amount of the treatment liquid that is to be supplied. In an example, the second treatment liquid supply line 878b may be provided to a line branched from the first treatment liquid supply line 876b. The main nozzle 878 receives the treatment liquid from the second treatment liquid supply line 878b and discharges the treatment liquid. The main nozzle 878 has a slit discharge hole of a slit shape. The slit discharge hole has a lengthwise direction that is parallel to the guide rail 862. The slit discharge hole may have a direction that faces the first direction 12. The slit discharge hole is downwardly inclined in a direction that faces the pre-treatment nozzle 876 from the main nozzle 878. The slit discharge hole is provide to have a length that is smaller than a radius of the substrate "W". An end of the slit discharge hole is located to be higher than an end of the stream discharge hole. According to an embodiment, the main nozzle 878 and the pre-treatment nozzle 876 may be disposed along the second direction 14. The main nozzle 878 may have a slit discharge hole that is downwardly inclined such that the treatment liquid is discharged to the same point of the pre-treatment nozzle 876. In an example, the main nozzle 878 may be provided as a slit nozzle.

The wetting nozzle 874 discharges a wetting liquid in a stream scheme. The wetting nozzle 874 is located to be adjacent to the pre-treatment nozzle 876 and the main nozzle 878. The wetting nozzle 874 is disposed along the first direction 12 with respect to the pre-treatment nozzle 876. A wetting liquid supply line 874b, in which a wetting liquid valve 874a is installed, is connected to the wetting nozzle 874. The wetting nozzle 874 receives the wetting nozzle from the wetting liquid supply line 874b and discharges the wetting liquid. The wetting nozzle 874 has a circular discharge hole. The discharge hole of the wetting nozzle 874 faces a vertically downward direction. As an example, the wetting liquid may be pure water.

The second nozzle unit 880 includes a rinsing liquid nozzle 875, a rotary shaft 861, and a rinsing arm 863. The second nozzle unit 880 supplies the rinsing liquid onto the substrate "W". In an example, the rinsing liquid nozzle 875 supplies the rinsing liquid in a dropping scheme. The rinsing liquid may be supplied in a circular stream form. The rotary shaft 861 and the rinsing arm 863 are provided to a nozzle driver that moves the rinsing liquid nozzle 875. In an example, the rotary shaft is located on an opposite side of the treatment container 820. The rotary shaft is located not to overlap a path, in which the first nozzle unit 870 moves. The rotary shaft 861 may be rotated about the central axis thereof by the driver (not illustrated). The rinsing arm 863 has a bar shape that extends long from an upper end of the rotary shaft 861 in a direction that is perpendicular to the rotary shaft 861. The rinsing liquid nozzle 875 is installed at an end of the rinsing arm 863. The rinsing liquid nozzle 875 is moved to a process location and a standby location by the rinsing arm 863 and the rotary shaft 861. Here, the process location is a location, at which the rinsing liquid nozzle 875 faces the substrate "W" supported by the support unit 810, and the standby location is a location that deviates from a location, at which the rinsing liquid nozzle 875 corresponds to the support unit 810. The rinsing liquid nozzle 875 receives the rinsing liquid from the rinsing liquid supply line 875b and discharges the rinsing liquid. A third valve 875a is installed in the rinsing liquid supply line 875b to adjust whether the rinsing liquid is to be supplied to the rinsing liquid nozzle 875 or an amount of the rinsing liquid that is to be supplied. The rinsing liquid may be a liquid that may rinse the development liquid. As an example, the rinsing liquid may be pure water.

The controller 890 controls the driving member 815, the wetting liquid valve 876a, the first valve 878a, the second valve 874a, and the third valve 875a. The controller 890 independently controls the valves such that the wetting liquid, the treatment liquid, and the rinsing liquid are sequentially supplied onto the substrate "W". Furthermore, the controller 890 controls the driving member 814 such that a rotational speed of the substrate "W" varies according to the kinds of the liquids supplied onto the substrate "W".

Figure 9:
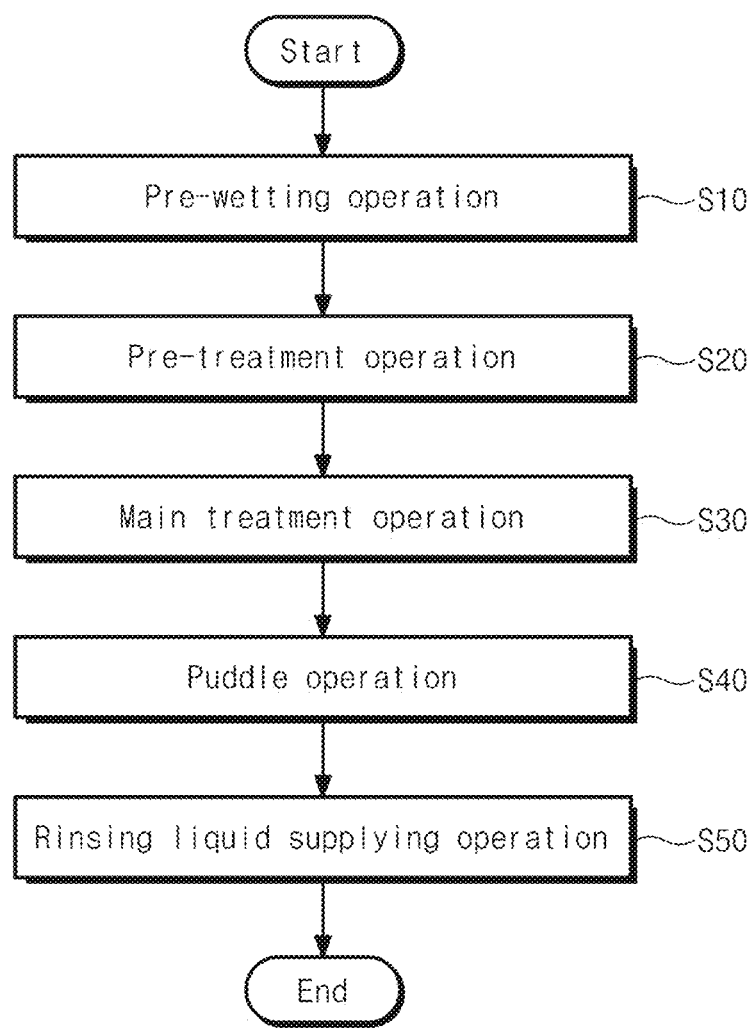
FIG. 9 is a plan view illustrating a process of treating a substrate by using the substrate treating apparatus of FIG. 7.

Next, a method for liquid-treating a substrate by using the aforementioned substrate treating apparatus 800 will be described. FIG. 9 is a flowchart illustrating a process of treating a substrate by using the substrate treating apparatus of the inventive concept. FIGS. 10 to 14 are views sequentially illustrating the substrate treating method of the inventive concept.

Referring to FIG. 9, the method for liquid-treating a substrate includes a pre-wetting operation S10, a pre-treatment operation S20, a main treatment operation S30, a puddle operation S40, and a rinsing liquid supplying operation S50. the pre-wetting operation S10, the pre-treatment operation S20, the main treatment operation S30, the puddle operation S40, and the rinsing liquid supplying operation S50 are sequentially performed.

Figure 10:
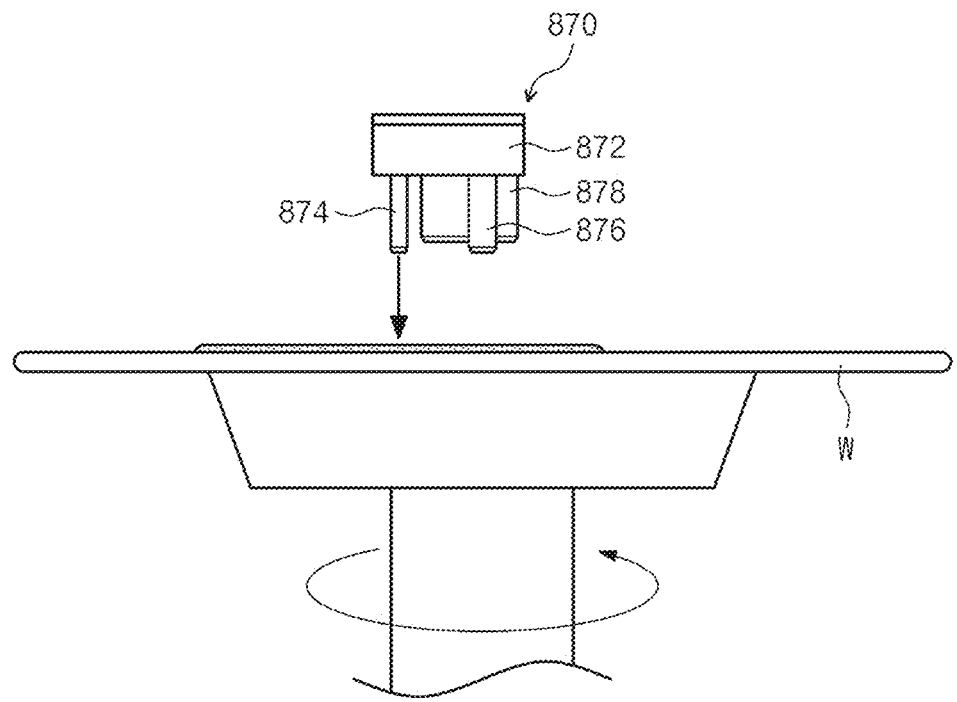
FIGS. 10 to 14 are views sequentially illustrating processes of treating a substrate by using the substrate treating apparatus of FIG. 7, respectively.

Referring to FIG. 10, when a substrate "W" is loaded on the support unit 810, the first nozzle unit 870 moves from the standby location to the process location. Here, the standby location is a location that does not correspond to the substrate "W" supported by the support unit 810, and the process location is a location that corresponds to the substrate "W" supported by the support unit 810. When the pre-wetting operation S10 is performed, the wetting nozzle 874 discharges the wetting liquid to the upper surface of the substrate "W" that rotates. In an example, the wetting nozzle 874 discharges the wetting liquid to a central area of the substrate "W". The discharged wetting liquid forms a wetting liquid film at an central area of the upper surface of the substrate "W". Although it has been described in the present embodiment that the wetting liquid film is formed at the central area of the substrate "W", it may be formed in the entire area of the substrate "W". Accordingly, the substrate "W" is converted into a wet state by the wetting liquid. When the pre-wetting operation S10 is completed, the pre-treatment operation S20 is performed.

The wetting liquid supplying operation may be performed for a period of time of t1, the pre-treatment operation S20 may be performed for a period of time of t2, the main treatment operation S30 may be performed for a period of time of t3, the puddle operation S40 may be performed for a period of time of t4, and the rinsing liquid supplying operation S50 may be performed for a period of time of t5. In an example, t5 may be a period of time that is longer than t1 to t4. In an example, t3 may be a period of time that is longer than t2. For example, t1 may be 2 seconds to 6 seconds, t2 may be 10 seconds to 25 seconds, t3 may be 20 seconds to 40 seconds, t4 may be 0 second to 6 seconds, and t5 may be 25 seconds to 50 seconds.

Figure 11:
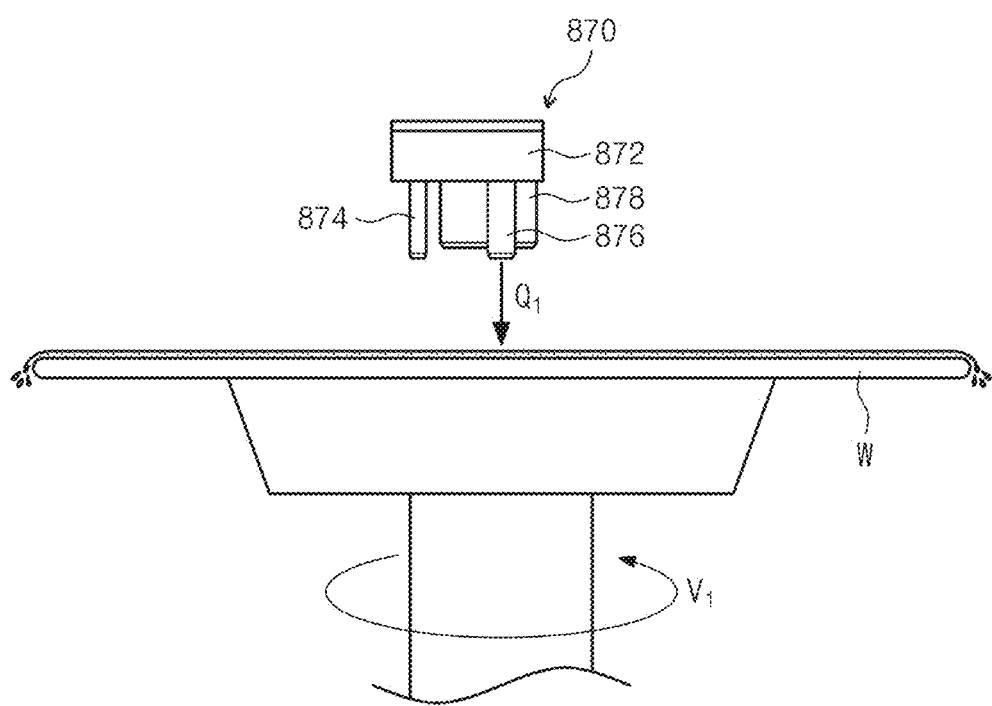

Referring to FIG. 11, when the pre-treatment operation S20 is performed, the pre-treatment nozzle 876 discharges the treatment liquid to the central area of the substrate "W", on which the wetting liquid film is formed. In an example, the pre-treatment nozzle 876 discharges the treatment liquid in a stream scheme. The pre-treatment nozzle 876 discharges the treatment liquid in a vertically downward direction. The discharged treatment liquid is mixed with the wetting liquid film and is diffused to the entire area of the substrate "W". A liquid film of the treatment liquid having a first thickness is formed in the entire area of the upper surface of the substrate "W". In an embodiment, when the pre-treatment operation S20 is performed, the substrate "W" is rotated at a first speed V1. In an example, in the pre-treatment operation S20, the treatment liquid is supplied at a flow amount of Q1 per unit time. In an embodiment, Q1 may be 100 cc to 300 cc per second.

Figure 12:
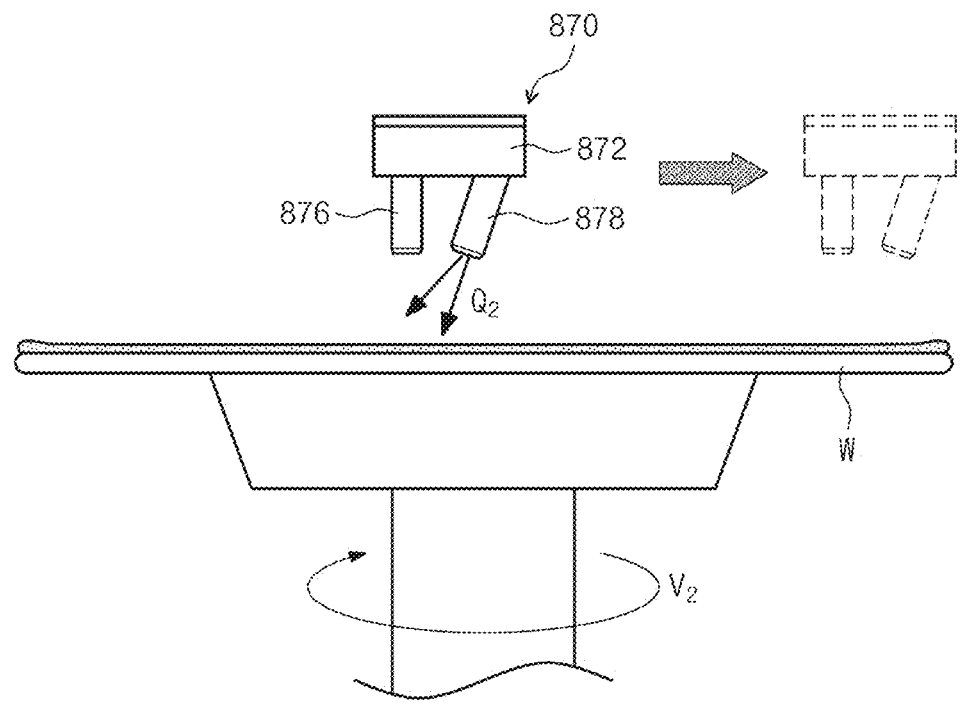

Thereafter, the pre-treatment operation S20 is completed, the main treatment operation S30 is performed. Referring to FIG. 12, the pre-treatment nozzle 876 stops discharging the treatment liquid. In an embodiment, in the pre-treatment operation S20, the substrate "W" is rotated at a second speed. The main nozzle 878 supplies the treatment liquid to the central area of the upper surface of the substrate "W". In an example, the main nozzle 878 discharges the treatment liquid to in a liquid curtain scheme. In an example, the main nozzle 878 discharges the second treatment liquid in a downwardly inclined direction. A liquid film of the treatment liquid having a second thickness that is larger than the first thickness is formed in the entire area of the upper surface of the substrate "W".

Figure 15:
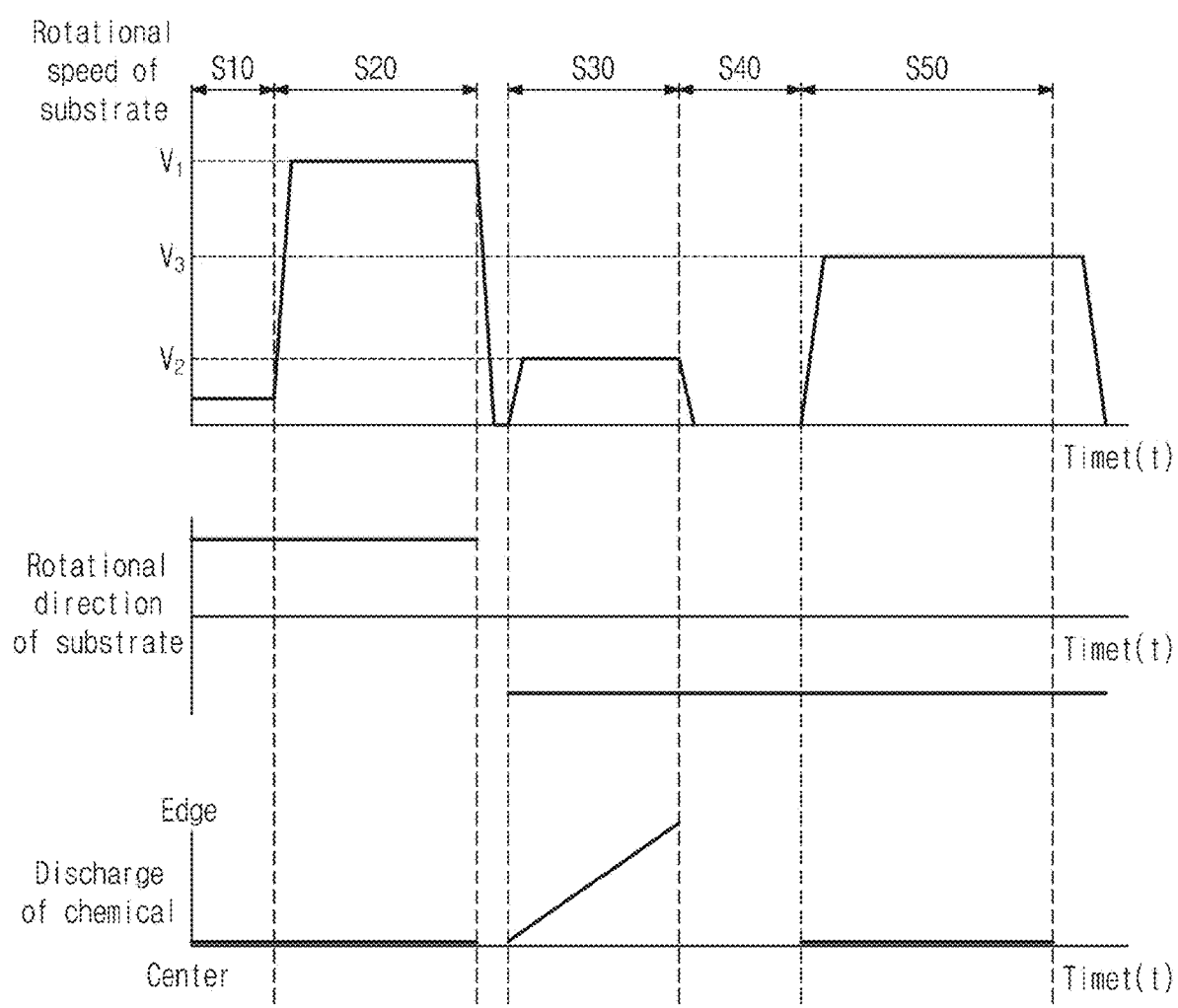
FIG. 15 is a view illustrating a substrate treating method according to the inventive concept in a graph according to lapse of time.

When the main nozzle 878 discharges the treatment liquid, a rotational direction of the substrate "W" is opposite to a rotational direction of the substrate "W" when the pre-treatment nozzle 876 discharges the treatment liquid. In an example, when the main treatment operation S30 is performed, the substrate "W" is rotated at a second speed V1. Referring to FIG. 15, the second speed V2 is lower than the first speed V1.

In an example, in the main treatment operation S30, the treatment liquid is supplied at a flow amount of Q2 per unit time. In an example, in the main treatment operation S30, the main nozzle 878 discharges the treatment liquid while changing a spotting point to a central area of the substrate "W" and an edge area of the substrate "W". For example, Q2 is larger than Q1. In an embodiment, Q2 may be 200 cc to 500 cc per second. In an example, Q1 and Q2 may be smaller when a viscosity of the treatment liquid is low as compared with the case in which the viscosity of the treatment liquid is high.

In an example, in the main treatment operation S30, a movement speed of the main nozzle 878 may be changed. For example, the movement speed of the main nozzle 878 may be low in, among all areas of the substrate "W", an area, in which an aspect ratio of a pattern formed on the substrate "W" is high.

Figure 13:
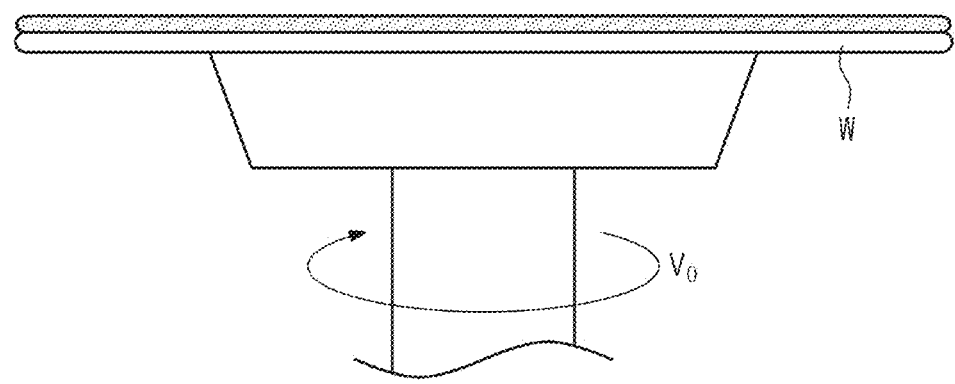

When the main treatment operation S30 is completed, the puddle operation S40 is performed. Referring to FIG. 13, in the puddle operation S40, the substrate "W" is rotated at a speed of V0. In an example, V0 may be 0 or a speed that is close to 0. As the puddle operation S40 is performed, a photosensitive film and the treatment liquid on the substrate "W" may sufficiently react with each other. Further, the puddle operation S40 prevents the development treatment of a central area and a middle area of the substrate "W" from being insufficient as compared with an edge area thereof as a thickness of the treatment liquid film in the central area and the middle area of the substrate "W" is smaller than a thickness of the treatment liquid film in the edge area thereof.

Figure 14:
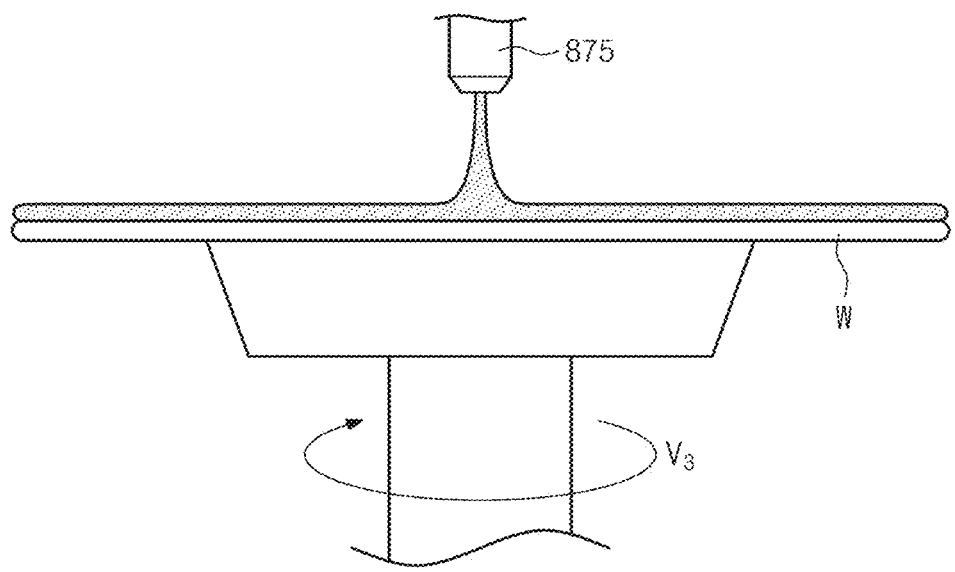

When the puddle operation S40 is completed, the rinsing liquid supplying operation S50 is performed. Referring to FIG. 14, when the rinsing liquid supplying operation S50 is performed, the rinsing liquid nozzle discharges the rinsing liquid to the upper surface of the substrate "W" that rotates. In an example, the rinsing liquid nozzle supplies the rinsing liquid to the central area of the substrate "W". Referring to FIG. 15, in the rinsing liquid supplying operation S50, the substrate "W" is rotated at a third speed V3. In an example, the third speed V3 is lower than the first speed V1, and is higher than the second speed V2. In an example, the third speed V3 is a speed, at which the rinsing liquid does not spatter onto the substrate "W".

Referring to FIG. 15, in an example, in the puddle operation S40 and the rinsing liquid supplying operation S50, a rotational direction of the substrate "W" is the same as in the main treatment operation S30.

Figure 16:
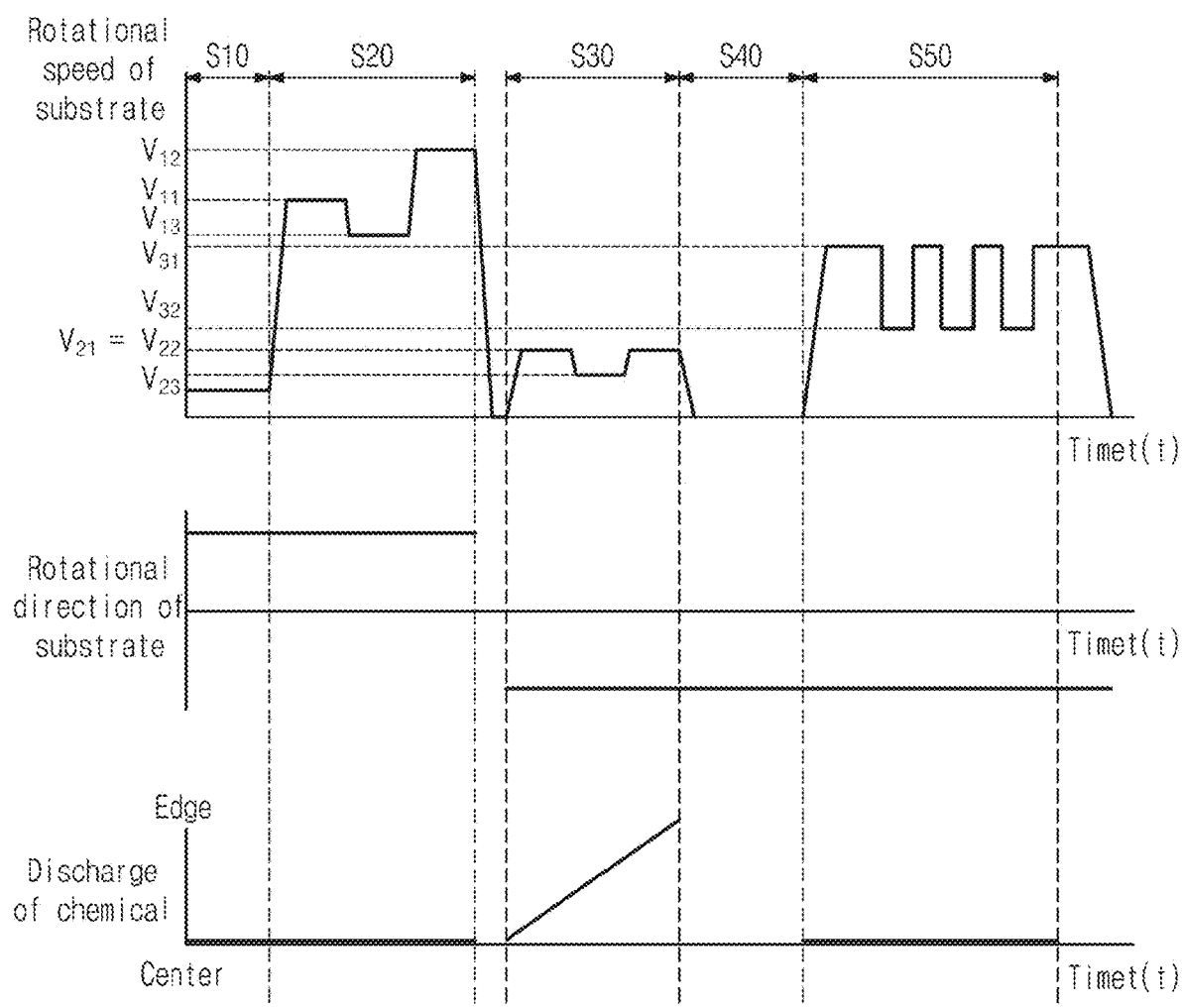
FIGS. 16 to 18 are views illustrating other examples of the substrate treating method according to the inventive concept in graphs according to lapse of time, respectively.

In the above-described example, it has been described that the substrate "W" is rotated at the speed of V1 in the pre-treatment operation S20, is rotated at the speed of V2 in the main treatment operation S30, and is rotated at the speed of V3 in the rinsing liquid supplying operation S50. However, unlike this, as illustrated in FIG. 16, the rotational speed of the substrate "W" may be changed in the pre-treatment operation S20, the main treatment operation S30, and the rinsing liquid supplying operation S50.

In an example, the pre-treatment operation S20 may include an initial pre-treatment operation, a middle pre-treatment operation, and a late pre-treatment operation. In the initial pre-treatment operation, the substrate "W" is rotated at a speed V11 of an initial pre-treatment. In the middle pre-treatment operation, the substrate "W" is rotated at a speed V13 of a middle pre-treatment. In the late pre-treatment operation, the substrate "W" is rotated at a speed V12 of a later pre-treatment. In an example, the speed V12 of the late pre-treatment is higher than the speed V11 of the initial pre-treatment, and the speed V13 of the middle pre-treatment is lower than the speed V11 of the initial pre-treatment.

In an example, the main treatment operation S30 may include an initial main treatment operation, a middle main treatment operation, and a late main treatment operation. In the initial main treatment operation, the substrate "W" is rotated at a speed V21 of an initial main treatment. In the middle main treatment operation, the substrate "W" is rotated at a speed V23 of a middle main treatment. In the late main treatment operation, the substrate "W" is rotated at a speed V22 of a late main treatment. In an example, the speed V23 of the middle main treatment is lower than the speed V21 of the initial main treatment and the speed V22 of the late main treatment. In an example, the speed V21 of the initial main treatment and the speed V22 of the late main treatment are the same. In an example, the speed V21 of the initial main treatment and the speed V22 of the late main treatment may be lower than the speed V23 of the middle main treatment. Accordingly, the rotational speed of the substrate "W" in the main treatment operation S30 does not exceed the rotational speed of the substrate "W" in the pre-treatment operation S20.

In an example, the rinsing liquid supplying operation S50 includes a first rotation operation and a second rotation operation. In an example, the first rotation operation and the second rotation operation are repeatedly performed sequentially. In the first rotation operation, the substrate "W" is rotated at a first rotational speed V31. In the second rotation operation, the substrate "W" is rotated at a second rotational speed V32 that is lower than the first rotational speed V31. In an embodiment, the first rotational speed V31 is lower than the speed V13 of the middle pre-treatment, and the second rotational speed V32 is higher than the speed V21 of the initial main treatment. Accordingly, the rotational speed of the substrate "W" in the rinsing liquid supplying operation S50 is lower than the rotational speed of the substrate "W" in the pre-treatment operation S20, and is higher than the rotational speed of the substrate "W" in the main treatment operation S30.

In the above-described example, it has been described that the rotational speed of the substrate "W" is changed in the pre-treatment operation S20, the main treatment operation S30, and the rinsing liquid supplying operation S50. However, unlike this, the rotational speed of the substrate "W" may be changed in any one or more of the pre-treatment operation S20, the main treatment operation S30, and the rinsing liquid supplying operation S50.

Figure 17:
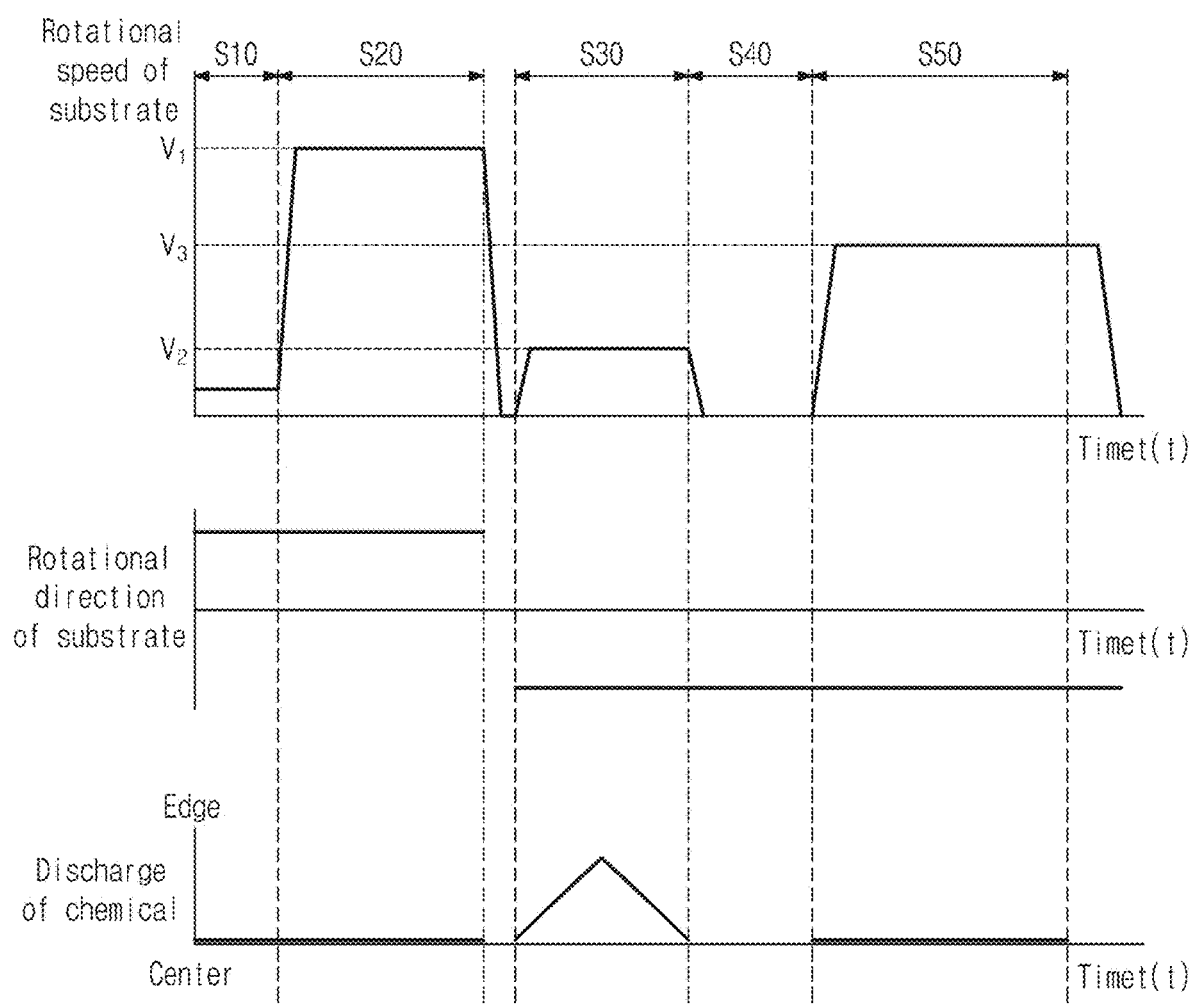

In the above-described example, it has been described that in the main treatment operation S30, the main nozzle 878 discharges the treatment liquid while changing a spotting point to a central area of the substrate "W" and an edge area of the substrate "W". However, unlike this, as illustrated in FIG. 17, the main nozzle 878 may discharge the treatment liquid while changing a spotting point to a central area of the substrate "W" and an edge area of the substrate "W" a plurality of times.

Figure 18:
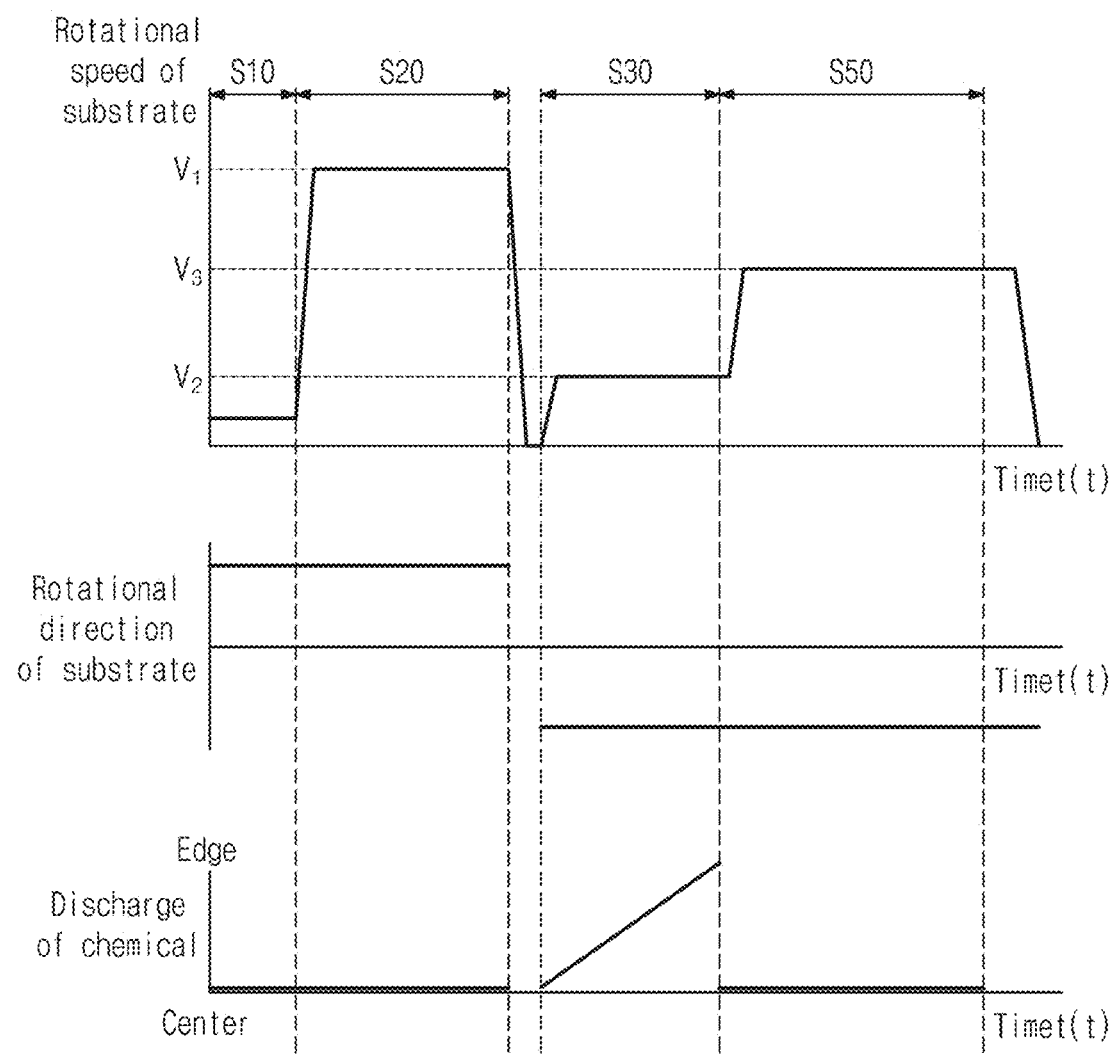

In the above-described example, it has been described that the puddle operation S40 is performed. However, unlike this, as illustrated in FIG. 18, the rinsing liquid supplying operation S50 may be performed immediately after the main treatment operation S30. In particular, the puddle operation S40 may be omitted when the viscosity of the treatment liquid is low.

In the above-described example, it has been described that, in the puddle operation S40 and the rinsing liquid supplying operation S50, a rotational direction of the substrate "W" is the same as in the main treatment operation S30. However, unlike this, in the main treatment operation S30, the puddle operation S40, and the rinsing liquid supplying operation S50, rotational directions of the substrate "W" may be opposite to each other.

In the above-described example, It has been described that the pre-treatment nozzle 876 and the main nozzle 878 are supported by the same arm. Accordingly, a phenomenon, in which the treatment liquid is dried during the movement times of the nozzles. However, unlike this, the pre-treatment nozzle 876 and the main nozzle 878 may be supported by separate arms. Then, in order to prevent a phenomenon, in which the treatment liquid is dried during the movement times of the nozzles, the main nozzle 878 starts to discharge the treatment liquid without any delay immediately after the treatment is completely discharged by the pre-treatment nozzle 876.

According to the embodiment of the inventive concept, the pre-treatment operation S20 is performed before the main treatment operation S30 is performed. In the pre-treatment operation S20, the treatment liquid is supplied onto the substrate "W" in a stream scheme, and the treatment liquid film is formed. Accordingly, in the main treatment operation S30, stains may be minimized from being generated while the treatment liquid is supplied in the liquid curtain scheme.

Furthermore, according to the embodiment of the inventive concept, the substrate "W" is liquid-treated in the liquid curtain scheme of the main nozzle 878 after the substrate "W" is liquid-treated in the stream scheme of the pre-treatment nozzle 876. Accordingly, disadvantages that occur while the liquid-treatments are performed by using the pre-treatment nozzle 876 and the main nozzle 878 may be mutually supplemented.

Furthermore, according to the embodiment of the inventive concept, the substrate "W" is liquid-treated in the liquid curtain scheme on the substrate "W", on which the liquid film is formed. Accordingly, a larger amount of the treatment liquid than in the pre-treatment operation S20 is provided onto the substrate "W", and accordingly, a period of time consumed in the liquid treatment operation of the substrate "W" may be shortened.

According to the embodiment of the inventive concept, in the pre-treatment operation S20, the substrate "W" is rotated at the speed of the initial pre-treatment, the rotational speed of the substrate "W" is lowered to the speed of the late pre-treatment, and then the substrate "W" is rotated at the high speed of the middle pre-treatment again, and thus the treatment liquid film is uniformly formed on the substrate "W".

According to the embodiment of the inventive concept, in the main treatment operation S30, the rotational direction of the substrate "W" is opposite to that in the pre-treatment operation S20. Accordingly, the photosensitive film is peeled without orientation, and thus there is no difference of inclination in the pattern on the substrate "W".

According to the embodiment of the inventive concept, in the main treatment operation S30, the rotational direction of the substrate "W" in the main treatment operation S30 is lower than that in the pre-treatment operation S20. Accordingly, the treatment liquid is uniformly spread out onto the substrate "W", and the photosensitive film is peeled without orientation, and thus there is no difference of inclination in the pattern on the substrate "W".

According to the embodiment of the inventive concept, the spotting point of the main nozzle 878 is changed in the main treatment operation S30, and the movement speed of the main nozzle 878 may be adjusted. Accordingly, a reaction time is given to the development liquid and the pattern by providing a low speed in an area, in which patterns are dense, or an area, in which the aspect ratio of the pattern is high. Accordingly, the entire area of the substrate "W" may be uniformly developed.

According to the embodiment of the inventive concept, in the rinsing liquid supplying operation S50, the rotational speed of the substrate "W" is changed. Accordingly, the centrifugal force becomes different due to the acceleration and the deceleration of the rotational speed. Accordingly, a problem, in which rinsing is not uniformly made as an inertial force is generated in the liquid film of the substrate "W" when the rotational speed is the same in the conventional rinsing liquid supplying operation S50, may be solved.

Referring to FIGS. 1 to 4 again, the bake chamber 470 of the development module 402 heats the substrate "W". For example, the bake chambers 470 may perform a post bake process of heating the substrate "W" before the development process, a hard bake process of heating the substrate "W" after the development process, and a cooling process of cooling the heated substrate "W" after the bake process. The bake chamber 470 has a cooling plate 471 and a heating plate 472. The cooling plate 471 is provided with a cooling unit 473 such as cooling water or a thermoelectric element. The heating plate 472 is provided with a heating unit 474 such as a heating wire or a thermoelectric element. The cooling plate 471 and the heating plate 472 may be provided in one bake chamber 470. Optionally, some of the bake chambers 470 may include only a cooling plate 471, and some of the bake chambers 472 may include only a heating plate 472.

As described above, the application/development module 400 is provided such that the application module 401 and the development module 402 are separated. When viewed from the top, the application module 401 and the development module 402 may have the same chamber disposition.

The second buffer module 500 is provided as a passage through which the substrate "W" is transported, between the application/development module 400 and the pre/post-exposure module 600. The second buffer module 500 performs a process such as a cooling process or an edge exposing process on the substrate "W". The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the application module 401. The second cooling chamber 540 is disposed at a height corresponding to the development module 402. The buffer 520, the first cooling chamber 530, and the second cooling chamber 540 are disposed in a row along the third direction 16. When viewed from the top, the buffer 520 is disposed along the carrying chamber 430 of the application module 401 in the first direction 12. The edge exposing chamber 550 is spaced apart from the buffer 520 or the first cooling chamber 530 by a predetermined distance in the second direction 14.

The second buffer robot 560 transports the substrate "W" between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360. The first cooling chamber 530 and the edge exposing chamber 550 perform a succeeding process on the substrates "W", on which the application module 401 has performed a process. The first cooling chamber 530 cools the substrate "W", on which the application module 401 has performed a process. The first cooling chamber 530 has a structure similar to that of the cooling chamber 350 of the first buffer module 300. The edge exposing chamber 550 exposes peripheries of the substrates "W", on which the first cooling chamber 530 has performed a cooling process. The buffer 520 temporarily preserves the substrates "W" before the substrates "W", on which the edge exposing chamber 550 has performed a process, are transported to a pre-treatment module 601, which will be described below. The second cooling chamber 540 cools the substrates "W" before the substrates "W", on which a post-treatment module 602, which will be described below, has performed a process, are transported to the development module 402. The second buffer module 500 may further have a buffer at a height corresponding to the development module 402. In this case, the substrates "W", on which the post-treatment module 602 has performed a process, may be transported to the development module 402 after being temporarily preserved in the added buffer.

When the exposure apparatus 900 performs an immersion/exposure process, the pre/post-exposure module 600 may perform a process of applying a protective film that protects the photoresist film applied to the substrate "W" during the immersion/exposure process. The pre/post-exposure module 600 may perform a process of cleaning the substrate "W" after the exposure process. Furthermore, when the application process is performed by using a chemical amplification resist, the pre/post-exposure module 600 may perform a bake process after the exposure process.

The pre/post-exposure module 600 has a pre-treatment module 601 and a post-treatment module 602. The pre-treatment module 601 performs a process of treating the substrate "W" before the exposure process, and the post-treatment module 602 performs a process of treating the substrate "W" after the exposure process. The pre-treatment module 601 and the post-treatment module 602 may be disposed to be partitioned from each other in different layers.

According to an example, the pre-treatment module 601 is situated on the post-treatment module 602. The pre-treatment module 601 has the same height as that of the application module 401. The post-treatment module 602 has the same height as that of the development module 402. The pre-treatment module 601 has a protective film applying chamber 610, a bake chamber 620, and a carrying chamber 630. The protective film applying chamber 610, the carrying chamber 630, and the bake chamber 620 are sequentially disposed along the second direction 14. Accordingly, the protective film applying chamber 610 and the bake chamber 620 are spaced apart from each other in the second direction 14 while the carrying chamber 630 is interposed therebetween. A plurality of protective film applying chambers 610 are provided, and the plurality of protective film applying chambers 610 are disposed along the third direction 16 to form different layers. Optionally, a plurality of protective film applying chambers 610 may be provided in each of the first direction 12 and the third direction 16. A plurality of bake chambers 620 are provided, and the plurality of bake chambers 610 are disposed along the third direction 16 to form different layers. Optionally, a plurality of bake chambers 620 may be provided in each of the first direction 12 and the third direction 16.

The carrying chamber 630 is situated in parallel to the first cooling chamber 530 of the second buffer module 500 in the first direction 12. A pre-treatment robot 632 is situated in the carrying chamber 630. The carrying chamber 630 has a substantially square or rectangular shape. The pre-treatment robot 632 feeds the substrate "W" between the protective film applying chambers 610, the bake chambers 620, the buffer 520 of the second buffer module 500, and a first buffer 720 of the interface module 700, which will be described below. The pre-treatment robot 632 has a hand 633, an arm 634, and a support 635. The hand 633 is fixedly installed in the arm 634. The arm 634 has a flexible and rotatable structure. The arm 634 is coupled to the support 635 to be linearly movable in the third direction 16 along the support 635.

The protective film applying chamber 610 applies a protective film that protects a resist film during the immersion/exposure process, onto the substrate "W". The protective film applying chamber 610 has a housing 611, a support plate 612, and a nozzle 613. The housing 611 has an open-topped cup shape. The support plate 612 is situated in the housing 611, and supports the substrate "W". The support plate 612 may be provided to be rotatable. The nozzle 613 supplies a protection liquid for forming a protective film onto the substrate "W" positioned on the support plate 612. The nozzle 613 has a circular pipe shape, and may supply a protection liquid to the center of the substrate "W". Optionally, the nozzle 613 may have a length corresponding to the diameter of the substrate "W", and the discharge hole of the nozzle 613 may be a slit. In this case, the support plate 612 may be provided in a fixed state. The protection liquid includes an expandable material. The protection liquid may be a material that has a low affinity for a photoresist and water. For example, the protection liquid may include a fluorine-based solvent. The protective film applying chamber 610 supplies a protection liquid to a central area of the substrate "W" while rotating the substrate "W" positioned on the support plate 612.

The bake chamber 620 heat-treats the substrate "W", to which the protective film is applied. The bake chamber 620 has a cooling plate 621 and a heating plate 622. The cooling plate 621 is provided with a cooling unit 623 such as cooling water or a thermoelectric element. The heating plate 622 is provided with a heating unit 624 such as a heating wire or a thermoelectric element. The heating plate 622 and the cooling plate 621 may be provided in one bake chamber 620. Optionally, some of the bake chambers 620 may include only a heating plate 622, and some of the bake chambers 620 may include only a cooling plate 621.

The post-treatment module 602 has a cleaning chamber 660, a post-exposure bake chamber 670, and a carrying chamber 680. The cleaning chamber 660, the carrying chamber 680, and the post-exposure chamber 670 are sequentially disposed along the second direction 14. Accordingly, the cleaning chamber 660 and the post-exposure bake chamber 670 are spaced apart from each other in the second direction 14 while the carrying chamber 680 is interposed therebetween. A plurality of cleaning chambers 660 are provided, and the plurality of cleaning chambers 610 are disposed along the third direction 16 to form different layers. Optionally, a plurality of cleaning chambers 660 may be provided in each of the first direction 12 and the third direction 16. A plurality of post-exposure bake chambers 670 are provided, and the plurality of post-exposure bake chambers 670 are disposed along the third direction 16 to form different layers. Optionally, a plurality of post-exposure bake chambers 670 may be provided in each of the first direction 12 and the third direction 16.

When viewed from the top, the carrying chamber 680 is situated in parallel to the second cooling chamber 540 of the second buffer module 500 in the first direction 12. The carrying chamber 680 has a substantially square or rectangular shape. A post-treatment robot 682 is situated in the carrying chamber 680. The post-treatment robot 682 transports the substrate "W" between the cleaning chambers 660, the post-exposure bake chambers 670, the second cooling chamber 540 of the second buffer module 500, and a second buffer 730 of the interface module 700, which will be described below. The post-treatment robot 682 provided in the post-treatment module 602 may have the same structure as that of the pre-treatment robot 632 provided in the pre-treatment module 601.

The cleaning chamber 660 cleans the substrate "W" after the exposure process. The cleaning chamber 660 has a housing 661, a support plate 662, and a nozzle 663. The housing 661 has an open-topped cup shape. The support plate 662 is situated in the housing 661, and supports the substrate "W". The support plate 662 may be provided to be rotatable. The nozzle 663 supplies a cleaning liquid onto the substrate "W" positioned on the support plate 662. The cleaning liquid may be water such as deionized water. The cleaning chamber 660 supplies a cleaning liquid to a central area of the substrate "W" while rotating the substrate "W" positioned on the support plate 662. Optionally, the nozzle 663 may be linearly moved or rotated from a central area to a peripheral area of the substrate "W" while the substrate "W" is rotated.

After the exposure process, the bake chamber 670 heats the substrate "W", on which the exposure process has been performed, by using a far infrared ray. After the exposure process, in the bake process, the substrate "W" is heated to finish a property change of the photoresist by amplifying acid produced in the photoresist through the exposure process. After the exposure process, the bake chamber 670 has a heating plate 672. The heating plate 672 is provided with a heating unit 674 such as a heating wire or a thermoelectric element. After the exposure process, the bake chamber 670 may be further provided with a cooling plate 671 in the interior thereof. The cooling plate 671 is provided with a cooling unit 673 such as cooling water or a thermoelectric element. Optionally, a bake chamber having only a cooling plate 671 may be further provided.

As described above, the pre/post-exposure module 600 is provided such that the pre-treatment module 601 and the post-treatment module 602 are completely separated from each other. The carrying chamber 630 of the pre-treatment module 601 and the carrying chamber 680 of the post-treatment module 602 may have the same size, and may completely overlap each other when viewed from the top. The protective film applying chamber 610 and the cleaning chamber 660 may have the same size, and may completely overlap with each other when viewed from the top. The bake chamber 620 and the post-exposure chamber 670 may have the same size, and may completely overlap with each other when viewed from the top.

The interface module 700 feeds the substrate "W" between the pre/post-exposure module 600 and the exposure apparatus 900. The interface module 700 has a frame 710, a first buffer 720, a second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730. The first buffer 720 is situated at a height corresponding to the pre-treatment module 601, and the second buffer 730 is disposed at a height corresponding to the post-treatment module 602. When viewed from the top, the first buffer 720 is disposed along the first direction 12 while forming a row with the carrying chamber 630 of the pre-treatment module 601, and the second buffer 730 is disposed along the first direction 12 forming a row with the carrying chamber 630 of the post-treatment module 602.

The interface robot 740 is situated to be spaced apart from the first buffer 720 and the second buffer 730 in the second direction 14. The interface robot 740 transports the substrate "W" between the first buffer 720, the second buffer 730, and the exposure apparatus 900. The interface robot 740 has a structure that is substantially similar to that of the second buffer robot 560.

The first buffer 720 temporarily preserves the substrates "W", on which the pre-treatment module 601 has performed a process, before they are moved to the exposure apparatus 900. The second buffer 730 temporarily preserves the substrates "W", on which the exposure apparatus 900 has completely performed a process, before they are moved to the post-treatment module 602. The first buffer 720 has a housing 721 and a plurality of supports 722. The supports 722 are disposed within the housing 721, and are spaced apart from one another along the third direction 16. One substrate "W" is positioned on each of the supports 722. The housing 721 has openings (not illustrated) on a side on which the interface robot 740 is provided and on a side on which the pre-treatment robot 721 is provided so that the interface robot 740 and the pre-treatment robot 632 carry a substrate "W" into or out of the cooling plate 722. The second buffer 730 has a structure that is substantially similar to that of the first buffer 720. Meanwhile, the housing 731 of the second buffer 730 has openings on a side on which the interface robot 740 is provided and on a side on which the post-treatment robot 682 is provided. The interface module may be provided only with buffers and a robot as described above while a chamber that performs a certain process on a substrate "W" is not provided.

According to the embodiments of the inventive concept, the efficiency of a liquid treating process of a substrate may be improved.

According to the embodiments of the inventive concept, disadvantages that occur when a substrate is liquid-treated by using a stream nozzle and a slit nozzle, respectively, may be supplemented.

According to the embodiments of the inventive concept, a phenomenon, in which slopes of a pattern become different when a substrate is liquid-treated, may be prevented.

The effects of the inventive concept are not limited to the above-mentioned effects, and the unmentioned effects can be clearly understood by those skilled in the art to which the inventive concept pertains from the specification and the accompanying drawings.

What is claimed is:

1. A substrate treating apparatus comprising:
a support unit configured to support a substrate;
a liquid supply unit configured to supply a liquid onto the substrate supported by the support unit; and
a controller configured to control the liquid supply unit and the support unit,
wherein the liquid supply unit includes:
a pre-treatment nozzle configured to discharge a first treatment liquid in a stream scheme; and
a main nozzle configured to discharge a second treatment liquid in a liquid curtain scheme, and
wherein the controller controls the support unit such that a rotational direction of the substrate when the first treatment liquid is discharged from the main nozzle and a rotational direction of the substrate when the second treatment liquid is discharged from the pre-treatment nozzle are opposite to each other.

2. The substrate treating apparatus of claim 1, wherein the controller controls the liquid supply unit such that the pre-treatment nozzle discharges the first treatment liquid onto the substrate at a location corresponding to a central area of the substrate.

3. The substrate treating apparatus of claim 1, wherein the liquid supply unit further includes:
a support body, on which the main nozzle is mounted;
a support arm connected to the support body to be movable; and
a driver configured to move the support arm, and
wherein the controller controls the driver such that the second treatment liquid is discharged onto the substrate while a spotting point of the main nozzle is changed from a central area of the substrate to an edge area of the substrate.

4. The substrate treating apparatus of claim 3, wherein the controller controls the driver such that a movement speed of the main nozzle varies while the spotting point of the main nozzle is changed from the central area of the substrate to the edge area of the substrate.

5. The substrate treating apparatus of claim 4, wherein the controller controls the driver such that the movement speed of the main nozzle is slow in, among all areas of the substrate, an area, in which an aspect ratio of a pattern formed on the substrate is high.

6. The substrate treating apparatus of claim 1, wherein the controller controls the support unit such that the substrate is rotated at a first speed when the pre-treatment nozzle discharges the first treatment liquid onto the substrate, the substrate is rotated at a second speed when the main nozzle discharges the second treatment liquid onto the substrate, and the first speed is higher than the second speed.

7. The substrate treating apparatus of claim 6, wherein the liquid supply unit further includes:

a first treatment liquid supply line, in which a first valve is installed, and configured to supply the first treatment liquid to the pre-treatment nozzle; and a second treatment liquid supply line, in which a second valve is installed, and configured to supply the second treatment liquid to the main nozzle, and wherein the controller controls the first valve and the second valve such that the pre-treatment nozzle discharges the first treatment liquid and thereafter, the main nozzle discharges the second treatment liquid.

8. The substrate treating apparatus of claim 7, wherein the liquid supply unit further includes:

a rinsing liquid nozzle configured to supply a rinsing liquid onto the substrate; and a rinsing liquid supply line, in which a third valve is installed, and configured to supply the rinsing liquid to the rinsing liquid nozzle, and wherein the controller controls the support unit such that the substrate is rotated at a third speed when the ringing liquid nozzle discharges the rinsing liquid onto the substrate, and the second speed is lower than the first speed and the third speed.

9. The substrate treating apparatus of claim 8, wherein the controller controls the third valve such that the main nozzle discharges the second treatment liquid onto the substrate and thereafter, the rinsing liquid nozzle discharges the rinsing liquid.

10. The substrate treating apparatus of claim 1, wherein the pre-treatment nozzle discharges the first treatment liquid in a vertically downward direction, and wherein the main nozzle discharges the second treatment liquid in a downwardly inclined direction.

11. The substrate treating apparatus of claim 10, wherein the first treatment liquid and the second treatment liquid are the same liquid.

12. The substrate treating apparatus of claim 11, wherein the first treatment liquid and the second treatment liquid include a development liquid.

13. A substrate treating apparatus comprising:

a support unit configured to support a substrate;

a liquid supply unit configured to discharge a treatment liquid onto the substrate supported by the support unit; and a controller configured to control the liquid supply unit and the support unit, wherein the liquid supply unit includes:

a pre-treatment nozzle having a stream discharge hole and configured to discharge the treatment liquid in a stream scheme; and a main nozzle having a slit discharge hole and configured to discharge the treatment liquid in a liquid curtain scheme, wherein the stream discharge hole has a circular shape, and the slit discharge hole has a slit shape, and wherein the controller controls the support unit such that a rotational direction of the substrate when the treatment liquid is discharged from the main nozzle and a rotational direction of the substrate when the treatment liquid is discharged from the pre-treatment nozzle are opposite to each other.

14. The substrate treating apparatus of claim 13, wherein the liquid supply unit further includes:

a support body, on which the pre-treatment nozzle and the main nozzle are mounted.

15. The substrate treating apparatus of claim 13, wherein the slit discharge hole has a lengthwise direction that faces a first direction, and wherein the main nozzle and the pre-treatment nozzle are disposed along a second direction that is perpendicular to the first direction when viewed from a top.

16. The substrate treating apparatus of claim 15, wherein a length of the slit discharge hole is smaller than a radius of the substrate supported by the support unit.

17. The substrate treating apparatus of claim 15, wherein the slit discharge hole is downwardly inclined in a direction that faces the pre-treatment nozzle.

18. The substrate treating apparatus of claim 15, wherein an end of the slit discharge hole is located to be higher than an end of the stream discharge hole.

19. The substrate treating apparatus of claim 13, wherein the liquid supply unit further includes:

a rinsing liquid nozzle configured to discharge a rinsing liquid onto the substrate; and a nozzle body, on which the rinsing liquid nozzle is mounted.

20. The substrate treating apparatus of claim 19, wherein the controller controls the liquid supply unit such that, after the pre-treatment nozzle supplies the treatment liquid onto the substrate, the main nozzle supplies the treatment liquid onto the substrate, and thereafter, the rinsing liquid nozzle supplies the rinsing liquid onto the substrate.

* * * * *